United States Patent
Chuang et al.

(10) Patent No.: US 12,400,983 B2
(45) Date of Patent: Aug. 26, 2025

(54) SEMICONDUCTOR PACKAGES AND METHODS OF MANUFACTURING THEREOF

(71) Applicant: Taiwan Semiconductor Manufacturing Company, Ltd., Hsinchu (TW)

(72) Inventors: Harry-Hak-Lay Chuang, Zhubei (TW); Wei Cheng Wu, Zhubei (TW); Wen-Tuo Huang, Tainan (TW); Yu-Ling Hsu, Tainan (TW); Pai Chi Chou, Taichung (TW); Ya-Chi Hung, Kaohsiung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 522 days.

(21) Appl. No.: 17/841,112

(22) Filed: Jun. 15, 2022

(65) Prior Publication Data
US 2023/0290748 A1 Sep. 14, 2023

Related U.S. Application Data

(60) Provisional application No. 63/319,196, filed on Mar. 11, 2022.

(51) Int. Cl.
*H01L 23/00* (2006.01)
*H01L 25/00* (2006.01)
(Continued)

(52) U.S. Cl.
CPC .............. *H01L 24/08* (2013.01); *H01L 24/80* (2013.01); *H01L 25/0657* (2013.01);
(Continued)

(58) Field of Classification Search
CPC ..... H01L 24/08; H01L 24/80; H01L 25/0657; H01L 25/18; H01L 25/50;
(Continued)

(56) References Cited

U.S. PATENT DOCUMENTS

| | | | |
|---|---|---|---|
| 2017/0170229 A1* | 6/2017 | Oh | H01L 27/14603 |
| 2018/0374864 A1* | 12/2018 | Fukuzumi | H01L 21/185 |
| 2021/0074709 A1* | 3/2021 | Liu | H10B 10/12 |

FOREIGN PATENT DOCUMENTS

TW 202203377 A 1/2022

OTHER PUBLICATIONS

Office Action issued in connection with Taiwan Appl. No. 112103182 dated Sep. 23, 2023.

* cited by examiner

*Primary Examiner* — Mohammed R Alam
(74) *Attorney, Agent, or Firm* — FOLEY & LARDNER LLP

(57) ABSTRACT

A semiconductor package includes a first wafer comprising a first substrate, a first device structure, and a first bonding layer having a pattern of first bonding pads. The first bonding layer is disposed over the first substrate and the first device structure. The semiconductor package includes a second wafer comprising a second substrate, a second device structure, and a second bonding layer having a pattern of second bonding pads. The second bonding layer is disposed over the first bonding layer. The second device structure is disposed over the second bonding layer. The second substrate is disposed over the second device structure. The first bonding pads are each aligned with a corresponding one of the second bonding pads. The first device structure is electrically coupled to the second device structure, through at least one of the first bonding pads and at least one of the second bonding pads.

20 Claims, 12 Drawing Sheets

(51) Int. Cl.
*H01L 25/065* (2023.01)
*H01L 25/18* (2023.01)

(52) U.S. Cl.
CPC .............. *H01L 25/18* (2013.01); *H01L 25/50* (2013.01); *H01L 2224/08145* (2013.01); *H01L 2224/80895* (2013.01); *H01L 2224/80896* (2013.01); *H01L 2225/06541* (2013.01); *H01L 2924/1431* (2013.01); *H01L 2924/1434* (2013.01)

(58) Field of Classification Search
CPC . H01L 2224/08145; H01L 2224/80895; H01L 2224/80896; H01L 2225/06541; H01L 2924/1431; H01L 2924/1434; H01L 2224/80894; H01L 24/27; H01L 21/56; H01L 21/60; H01L 23/3107; H01L 24/29; H01L 24/83; H01L 2224/27; H01L 2224/29; H10B 20/20
See application file for complete search history.

SEMICONDUCTOR PACKAGES AND METHODS OF MANUFACTURING THEREOF

CROSS-REFERENCE TO RELATED APPLICATION

This application claims priority to and the benefit of U.S. Provisional Application No. 63/319,196, filed Mar. 11, 2022, entitled "STACKED SEMICONDUCTOR CHIPS WITH IMPROVED I/O BANDWIDTH," which is incorporated herein by reference in its entirety for all purposes.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
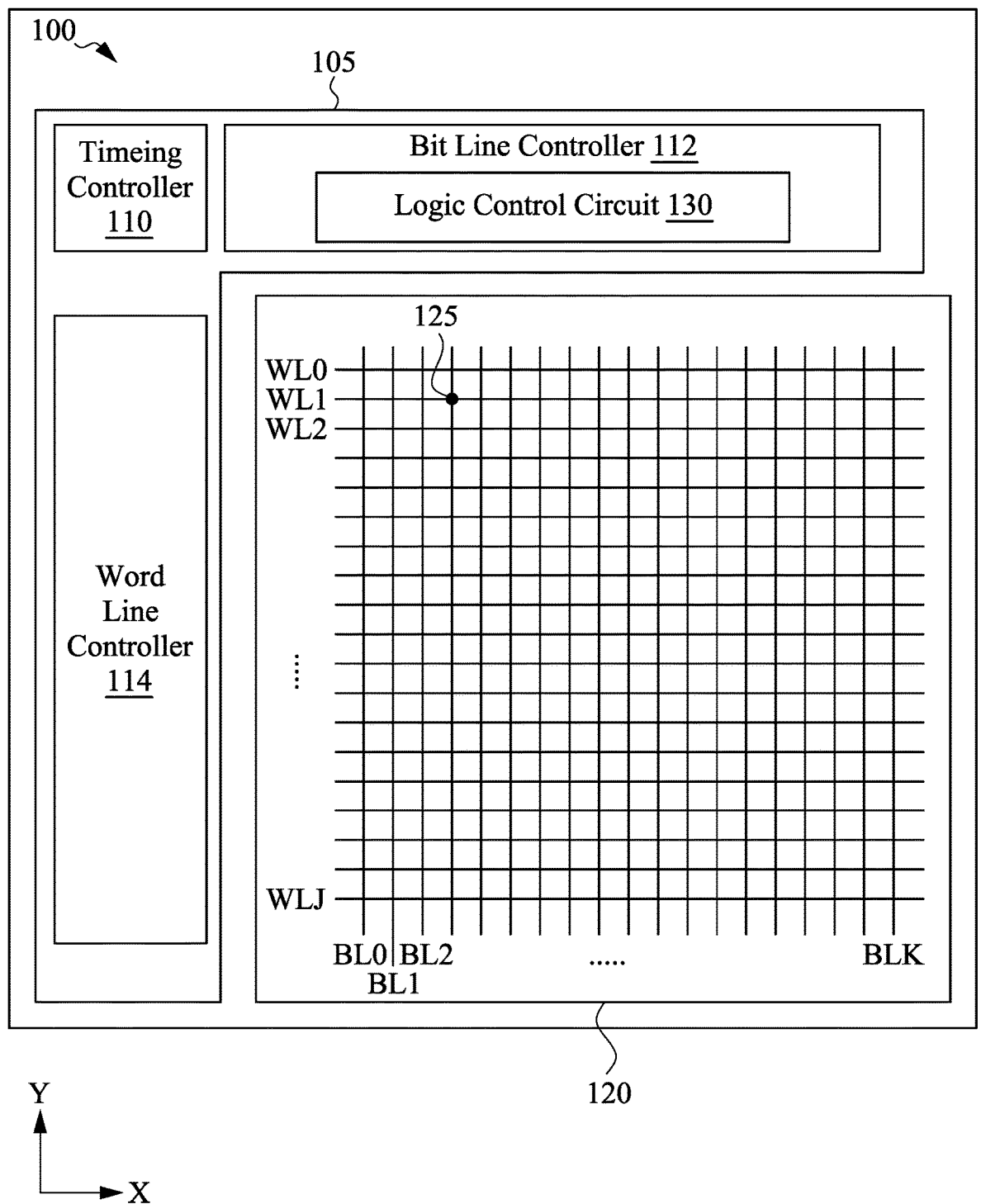
FIG. 1 is an illustration of a schematic block diagram of an example memory device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over, or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" "top," "bottom" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, the present disclosure is directed to bonded wafer device structures, such as a wafer-on-wafer (WoW) structure, and methods of fabricating bonded wafer device structures, that include different types of device structures on individual wafers. In various implementations, each wafer of the bonded wafer device structure can include or be formed with a respective device structure (e.g., a first device structure and a second device structure). The device structure of each wafer can be of different types, such as a logic device structure (e.g., sometimes generally referred to as logic portion or controller of a memory device) on a first wafer and a memory device structure (e.g., sometimes referred to as memory portion or memory array of the memory device). The logic structure can include, correspond to, or be a part of at least one of a simple programmable logic device (SPLD), a complex programmable logic device (CPLD), field-programmable gate array (FPGA), among others. The memory can include, correspond to, or be a part of any type of random access memory (RAM) (e.g., DRAM or SRAM) or read-only memory (ROM) (e.g., PROM, EPROM, or EEPROM). The wafers with logic structures and memory structures can be bonded to form a bonded wafer device structure. Forming different types of device structures on different wafers and bonding the wafers can increase the input/output (I/O) bandwidth between the device structures, such as improving the cross-talk speed between the memory and the logic or controller.

In the conventional process for wafer structure fabrication, the logic structure and the memory structure may be formed on the same wafer. However, this advanced packaging methodology for memory devices (e.g., high bandwidth memory) may only achieve a block size of 1024 bytes, thereby limiting the cross-talk I/O bandwidth between the memory device and the logic device. As such, with further applications (e.g., wireless communication, artificial intelligence (AI), machine learning, etc.) handling a higher volume of data, it is desirable to increase/expand the I/O bandwidth to increase computational speed and data transmission capability.

Accordingly, there is a need for bonded wafer structures, and methods of fabricating bonded wafer structures, that enable improved I/O bandwidth (e.g., cross-talk) between the logic device and memory device. Various embodiments disclosed herein include forming a first wafer with a first device structure and a second wafer with a second device structure. In some embodiments, the first device structure and the second device structure can be a memory structure and a logic structure, or vice versa. This can enable an increase I/O bandwidth for improving cross-talk speed between the memory and the logic, thereby improving the overall calculation or computational speed for various applications.

Referring to FIG. 1, depicted is an illustration of a schematic block diagram of an example memory device 100, in accordance with some embodiments. The block diagram of the memory device 100 shown in FIG. 1 is merely an example, and thus, it should be understood that the memory device 100 can include any of various other components while remaining within the scope of the present disclosure.

In some embodiments, the memory device 100 includes a memory controller 105 (e.g., logic portion of the memory device 100) and a memory array 120 (e.g., memory portion of the memory device 100). The memory array 120 may include a plurality of storage circuits or memory cells 125 arranged in two- or three-dimensional arrays. Each memory cell 125 may be coupled to a corresponding word line (WL) and a corresponding bit line (BL). The memory controller 105 may write data to or read data from the memory array 120 according to electrical signals through word lines WL and bit lines BL. In other embodiments, the memory device 100 includes more, fewer, or different components than shown in FIG. 1.

The memory array 120 is a hardware component that stores data. In one aspect, the memory array 120 is embodied as a semiconductor memory device or structure. The memory array 120 includes a plurality of storage circuits or memory cells 125. The memory array 120 includes word lines WL0, WL1 . . . WLJ, each extending in a first direction (e.g., X-direction) and bit lines BL0, BL1 . . . BLK, each extending in a second direction (e.g., Y-direction). The word lines WL and the bit lines BL may be conductive metals or conductive rails. In one configuration, each memory cell 125 is coupled to a corresponding word line WL and a corresponding bit line BL, and can be operated according to voltages or currents through the corresponding word line WL and the corresponding bit line BL. In some embodiments, each bit line includes bit lines BL, BLB coupled to one or more memory cells 125 of a group of memory cells 125 disposed along the second direction (e.g., Y-direction). The bit lines BL, BLB may receive and/or provide differential signals. Each memory cell 125 may include a volatile memory, a non-volatile memory, or a combination of them. In some embodiments, each memory cell 125 is embodied as a dynamic random access memory (DRAM) cell, static random access memory (SRAM) cell, or other types of memory cells. In some implementations, each memory cell 125 is embodied as any type of read-only memory cell (e.g., PROM, EPROM, EEPROM, etc.). In some embodiments, the memory array 120 includes additional lines (e.g., select lines, reference lines, reference control lines, power rails, etc.).

The memory controller 105 is a hardware component that controls operations of the memory array 120. In some embodiments, the memory controller 105 includes a bit line controller 112, a word line controller 114, and a (e.g., timing) controller 110. The bit line controller 112, the word line controller 114, and the timing controller 110 may be embodied as logic circuits, analog circuits, or a combination of them. In one configuration, the word line controller 114 is a circuit that provides a voltage or current through one or more word lines WL of the memory array 120, and the bit line controller 112 is a circuit that provides or senses a voltage or current through one or more bit lines BL of the memory array 120. In one configuration, the timing controller 110 is a circuit that provides control signals or clock signals to synchronize operations of the bit line controller 112 and the word line controller 114. In some embodiments, the timing controller 110 is embodied as or includes a processor and a non-transitory computer-readable medium storing instructions when executed by the processor cause the processor to execute one or more functions of the timing controller 110 or the memory controller 105 described herein. The bit line controller 112 may be coupled to bit lines BL of the memory array 120, and the word line controller 114 may be coupled to word lines WL of the memory array 120. In some embodiments, the memory controller 105 includes more, fewer, or different components than shown in FIG. 1.

In one example, the timing controller 110 may generate control signals to coordinate operations of the bit line controller 112 and the word line controller 114. In one approach, to write data to a memory cell 125, the timing controller 110 may cause the word line controller 114 to apply a voltage or current to the memory cell 125 through a word line WL coupled to the memory cell 125 and cause the bit line controller 112 to apply a voltage or current corresponding to data to be stored to the memory cell 125 through a bit line BL coupled to the memory cell 125. In one approach, to read data from a memory cell 125, the timing controller 110 may cause the word line controller 114 to apply a voltage or current to the memory cell 125 through a word line WL coupled to the memory cell 125 and cause the bit line controller 112 to sense a voltage or current corresponding to data stored by the memory cell 125 through a bit line BL coupled to the memory cell 125.

In some embodiments, the bit line controller 112 includes a logic control circuit 130 configured to control the operations of one or more components of the memory controller 105 (e.g., bit line controller 112) or the memory array 120. The bit line controller 112 may include other circuits, such as a precharge circuit, reset voltage control circuit, or sense amplifier (not shown). The logic control circuit 103 can operate together with other circuits or components to determine data stored by a memory cell 125, among other operations. For example, the reset voltage control circuit may set a voltage of a bit line BL to a reset voltage level during a reset phase, and the precharge circuit may set the voltage of the bit line BL to a precharge voltage level or a supply voltage level during a precharge phase. During a sensing phase, the bit line BL may be discharged according to data stored by the memory cell. The sense amplifier may sense the voltage or current of the bit line during the sensing phase to determine the data stored by the memory cell 125. The logic control circuit 130 can control these circuits to perform their respective functionalities. In some implementations, the logic control circuit 130 can perform the features or functionalities of other circuits described herein. In some embodiments, the bit line controller 112 includes more, fewer, or different components than shown in FIG. 1.

In some embodiments, the logic control circuit 130 is a component that generates one or more control signals to control operations of one or more circuits or components of the bit line controller 112. In some embodiments, the logic control circuit 130 can be replaced by a different circuit or a different component that can perform the functions of the logic control circuit 130 described herein. In some embodiments, the logic control circuit 130 is implemented as a field-programmable gate array (FPGA), digital logic circuit, application-specific integrated circuit (ASIC), etc. In some embodiments, the logic control circuit 130 is implemented as or replaced by a processor and a non-transitory computer-readable medium storing instructions when executed by the processor cause the processor to perform various functions of the logic control circuit 130 described herein. In one aspect, the logic control circuit 130 generates control signals, and provides the control signals to one or more other circuits to coordinate operations of the respective circuits, such as the precharge circuit, reset voltage control circuit, sense amplifier, among others. For example, to read data stored by a memory cell 125, the logic control circuit 130 may configure or operate the precharge circuit, reset voltage control circuit, and sense amplifier through three phases: a reset phase, a precharge phase, and a sensing phase.

In the reset phase, the logic control circuit 130 may generate and provide control signals to the precharge circuit and the reset voltage control circuit to set a voltage of a bit line BL coupled to the memory cell 125 to the reset voltage level. For example, the logic control circuit 130 may generate control signals to enable the reset voltage control circuit and disable the precharge circuit during the reset phase. The logic control circuit 130 may generate a control signal to disable the sense amplifier during the reset phase.

In the precharge phase, the logic control circuit 130 may generate and provide control signals to the precharge circuit and the reset voltage control circuit to set the voltage of the bit line BL coupled to the memory cell 125 to the supply voltage level. For example, the logic control circuit 130 may generate control signals to disable the reset voltage control circuit and enable the precharge circuit during the precharge phase. The logic control circuit 130 may generate a control signal to disable the sense amplifier during the precharge phase. The logic control circuit 130 can provide other control signals or instructions to one or more circuits of the bit line controller 112, among other components of the memory controller 105 or memory array 120.

The memory controller 105 (e.g., logic portion) and the memory array 120 (e.g., memory portion) of the memory device 100 can be formed on different wafers to increase I/O bandwidth for improved cross-talk between the logic and memory. For example, a first device structure can be formed on a first wafer, and a second device structure can be formed on a second wafer. The first device structure can operatively function as one of a logic portion or a memory portion of the memory device 100, and the second device structure can operatively function as the other one of the logic portion or the memory portion of the memory device 100. The memory device 100 can include a high bandwidth memory device, for instance, as part of the memory portion of the memory device 100. As described herein, the first wafer and the second wafer can be bonded to (e.g., electrically) couple the first device structure and the second device structure so as to collectively function as the memory device 100. By bonding the first and second wafers including the first and second device structures, the memory device 100 can be formed with an increased I/O bandwidth compared to conventional memory device 100 formed with the logic and memory on a single wafer.

FIGS. 2A-11 are sequential cross-sectional views of an exemplary structure during a process of forming a bonded wafer device structure, such as a WoW structure, according to various embodiments of the present disclosure. The bonded wafer device structure may include multiple wafers, each of which may include individual (different) device structures and interconnect structures formed on a substrate. The wafers may be vertically stacked and bonded together to form an integrated bonded wafer device structure. In some embodiments, a plurality of bonding pads may be formed through at least one substrate of the bonded wafer device structure. In some embodiments, the bonded wafer device structure may be singulated (e.g., diced) to provide a plurality of integrated circuit (IC) chips. Although the exemplary embodiment shown in FIGS. 2A-11 illustrate a process of forming a bonded wafer device structure having two wafers, various bonded wafer device structures, and methods of forming such structures, that include more than two wafers are also within the contemplated scope of disclosure.

Figure 2A:
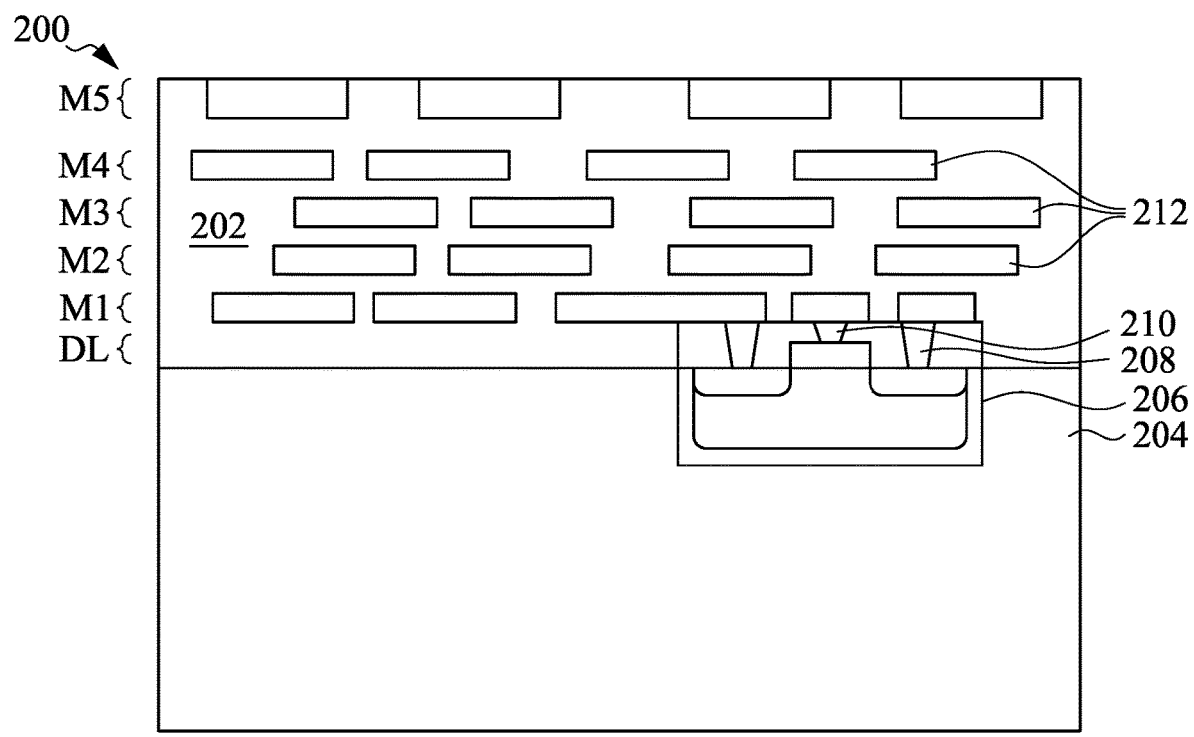
FIG. 2A is a cross-sectional view of a portion of a first wafer including a first device structure, in accordance with some embodiments.
Figure 2B:
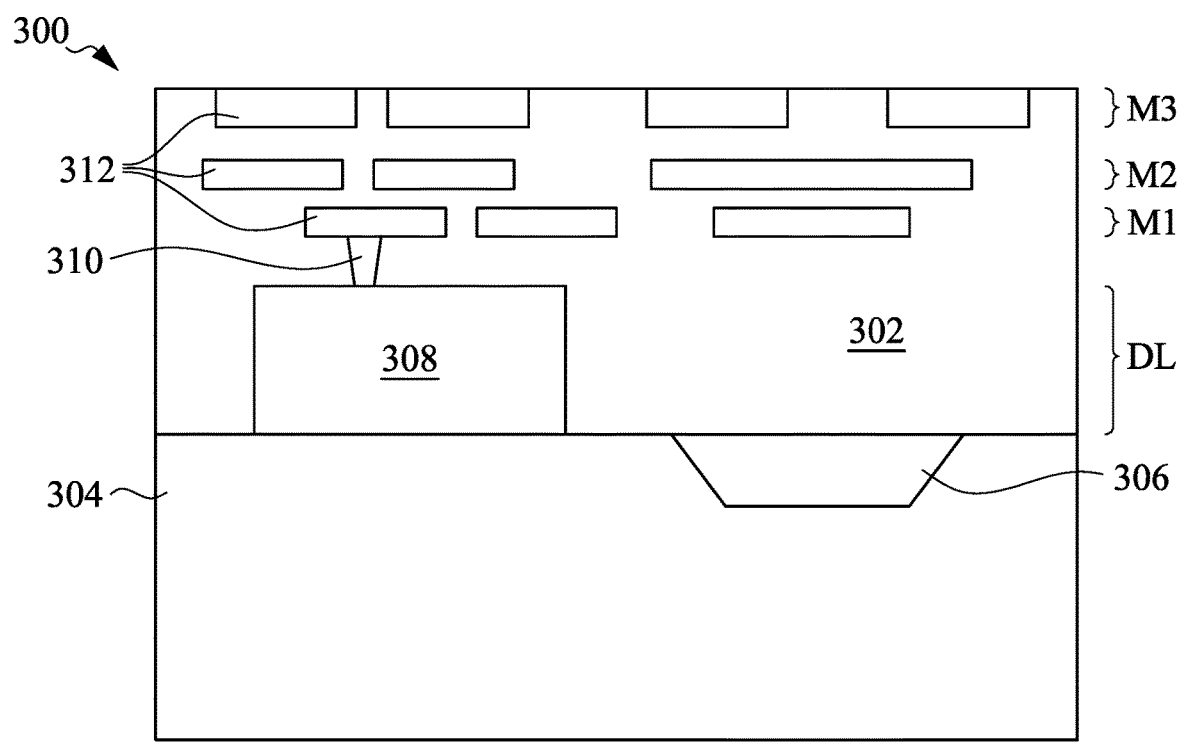
FIG. 2B is a cross-sectional view of a portion of a second wafer including a second device structure, in accordance with some embodiments.

FIG. 2A is a cross-sectional view of a portion of a first wafer 200 including a first device structure 206, in accordance with some embodiments. Although described as the first wafer 200 and the first device structure 206, in some cases, this wafer and device structure may be described as the second, third, or fourth wafer and device structure, among others. FIG. 2B is a cross-sectional view of a portion of a second wafer 300 including a second device structure 308, in accordance with some embodiments. Although described as the second wafer 300 and the second device structure 308, in some cases, this wafer and device structure may be described as the first, third, or fourth wafer and device structure, among others.

Referring to FIGS. 2A-B, the first wafer 200 and the second wafer 300 may each include a substrate 204, 304, a device structure 206, 308, and various interconnect structures 202, 208, 210, 212, 302, 310, 312 located on or over a surface (e.g., frontside surface) of the substrate 204, 304. Each of the first substrate 204 and the second substrate 304 may be a semiconductor material substrate that may include an elementary semiconductor such as silicon or germanium and/or a compound semiconductor such as silicon germanium, silicon carbide, gallium arsenic, indium arsenide, gallium nitride, or indium phosphide, or combinations of the same. Other semiconductor material substrates are within the contemplated scope of disclosure. In some embodiments, the first substrate 204 and/or the second substrate 304 may be a semiconductor-on-insulator (SOI) substrate. In some embodiments, at least one of first substrate 204 and the second substrate 304 may be a supporting substrate made of quartz, glass, or the like. In various embodiments, the first substrate 204 and the second substrate 304 may include the same material(s), or may include different materials.

In various embodiments, the first substrate 204 and/or the second substrate 304 may take the form of a planar substrate, a substrate with multiple fins, nanowires, or other forms known to people having ordinary skill in the art. Depending on the requirements of design, the first substrate 204 and/or the second substrate 304 may be a P-type semiconductor material substrate or an N-type semiconductor material substrate and may have doped regions therein. The doped regions may be configured for an N-type device or a P-type device.

The first substrate 204 and the second substrate 304 may each include a first major surface (e.g., a frontside) and a second major surface (e.g., a back side). In some embodiments, the first substrate 204 and/or the second substrate 304 may include isolation structures defining at least one active area on the frontside of the substrate 204, 304, and a device level (DL) (e.g., a first device layer) may be disposed on/in the active area. The device level (DL) may include at least one device structure 206, 308 formed on the respective substrate 204, 304. In some embodiments, the device structures 206, 308 may include active components, passive components, or a combination thereof. In some embodiments, the device structures 206, 308 may include or correspond to a logic portion and a memory portion. For example, the device structures 206, 308 can include integrated circuit devices. The device structures 206, 308 may be, for example, transistors, capacitors, resistors, diodes, photodiodes, fuse devices, or other similar devices. For instance, the device structure 308 (e.g., memory portion) can include a capacitor for storing data. In some embodiments, the first device level (DL), such as the device structure 206 (e.g., logic portion), may include gate electrodes, source/drain regions, spacers, and the like.

The first substrate 204 and the second substrate 304 may each further include an interconnect structure located over the frontside of the substrate 204, 304. Each of the interconnect structures may include a dielectric material 202, 302, which may include at least one inter-layer dielectric (ILD) layer and/or at least one inter-metal dielectric (IMD) layer, and metal features 212, 312 that may be located at least partially within the dielectric material 202, 302. The dielectric material 202, 302 may be formed of dielectric materials such as silicon oxide ($SiO_2$) silicon nitride (SiN, $Si_3N_4$), silicon carbide (SiC), or the like. Other dielectric materials are within the contemplated scope of disclosure. The dielectric material 202, 302 may be deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

The metal features of the interconnect structures may include any of a variety of via structures 208, 210, 310 and metal lines 212, 312. The metal features of the interconnect structures can include additional, fewer, or different via structures, such as via structures between, above, or below the metal lines 212, 312. The metal features may be formed of any suitable electrically conductive material, such as tungsten (W), copper (Cu), a copper alloy, aluminum (Al), an aluminum alloy, combinations thereof, or the like. Other electrically conductive materials are within the contemplated scope of disclosure. In some embodiments, barrier layers (not shown) may be disposed between the metal features and the dielectric material 202 or dielectric material 302 to prevent diffusion of the material of the metal features 212, 312 to surrounding features. The barrier layer may include Ta, TaN, Ti, TiN, CoW, or combinations thereof, for example. Other barrier layer materials are within the contemplated scope of disclosure.

The metal features 212, 312, as well as one or more via structures (e.g., electrically) connected to respective metal features 212, 312, may be configured to route electrical signals to and from, and/or in between, various device structures 206, 308 of the wafer 200, 300, some or all of which may be located on the device layer DL. In various implementations, the interconnect structure of each wafer 200, 300 may include various interconnect-level structures, where each interconnect-level structure may include a layer of dielectric material 202, 302 and various metal lines 212, 312 formed in the layer of dielectric material 202, 302. As shown in FIGS. 2A-B, for example, the interconnect structure of each wafer 200, 300 may include multiple metal levels (e.g., M1, M2, M3, etc.), where each metal level may include one or more metal lines 212, 312 embedded in a dielectric material 202, 302.

For example, a first metal level (M1) may be located over the device layer (DL). The one or more metal lines 212 of the first metal level (M1) can be (e.g., electrically) connected to the first device structure 206 by one or more via structures 208, 210. The one or more metal lines 312 of the first metal level (M1) can be (e.g., electrically) connected to the second device structure 308 by at least one via structure 310. Additional metal levels (e.g., M2, M3, etc.) may be located over the first metal level (M1). Each of the metal levels may be separated by a layer of dielectric material 202, 302. Additional via structures (not shown) may extend through the layer(s) of dielectric material 202, 302 to electrically connect metal lines 212, 312 of the different metal levels. Although wafers 200, 300 shown in FIGS. 2A-B include an interconnect structure having five metal levels (e.g., M1, M2, M3, M4, and M5) for wafer 200, and three metal levels (e.g., M1, M2, and M3 for wafer 300), it will be understood that an interconnect structure according to various embodiments may have a greater or lesser number of metal levels. In addition, although in various exemplary embodiments shown herein, the first wafer 200 and the second wafer 300 can include interconnect structures having the same number of metal levels, it will be understood that the interconnect structures of the first wafer 200 and the second wafer 300 may have a different number of metal levels.

In some cases, the first wafer 200 and the second wafer 300 can include additional, different, or fewer components independent of each other. For instance, the first wafer 200 can include the first device structure 206 associated with a logic portion (e.g., memory controller 105) of the memory device 100. The second wafer 300 can include the second device structure 308 associated with a memory portion (e.g., memory array 120) of the memory device 100. The second wafer 300 can include a shallow trench isolation (STI) structure 306 formed along the front surface of the substrate 304. The STI structure can be composed of a dielectric material, e.g., silicon oxide. For example, a portion of the substrate 304 can be etched using one or more etching techniques and/or masking techniques to form a trench at the frontside of the dielectric material 302. A dielectric material (e.g., different from or similar to the dielectric materials 202, 302) can be deposited above the etched portion of the substrate 304 to fill the trench, thereby forming the STI structure 306. In some implementations, the first wafer 200 may or may not include the STI structure. In some cases, the device structures 206, 308 of the wafers 200, 300 can operate independently of one another. In some other cases, the device structures 206, 308 of the wafers 200, 300 may not operate independently or may not be operable without each other, such that the wafers 200, 300 are formed or structured to be bonded with each other.

Figure 3A:
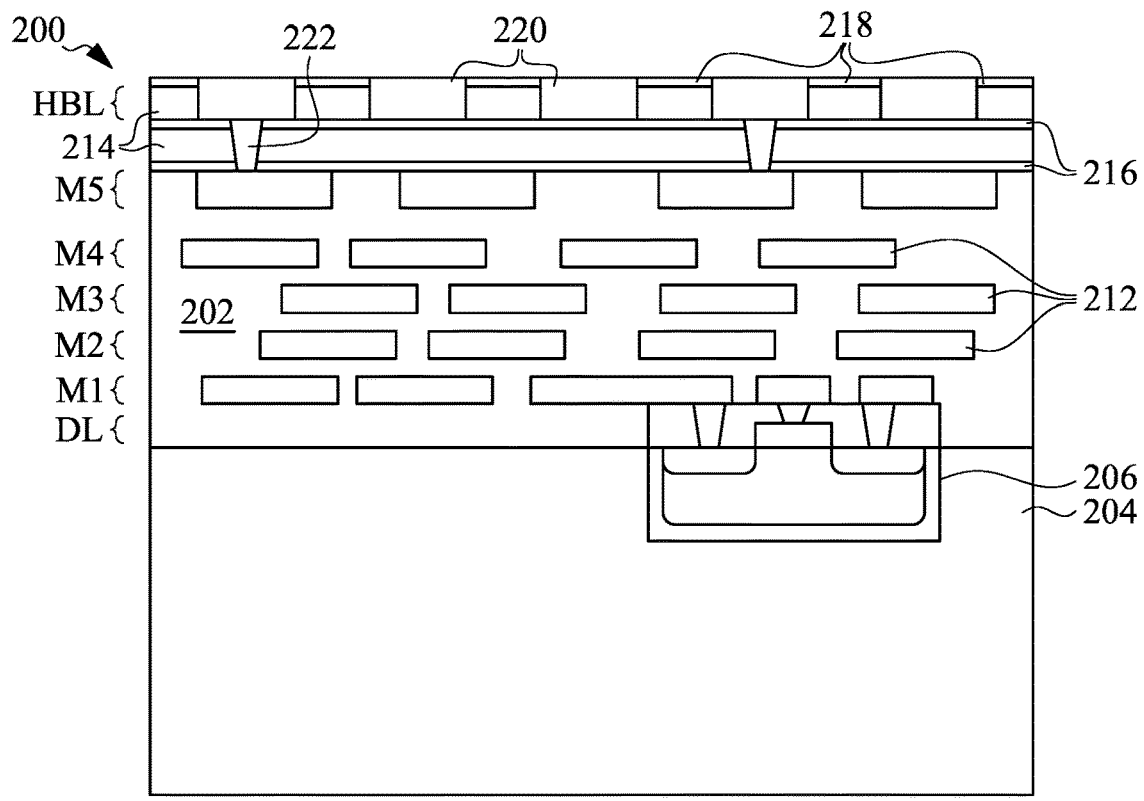
FIG. 3A is a cross-sectional view of a portion of the first wafer including the first device structure and a bonding layer, in accordance with some embodiments.
Figure 3B:
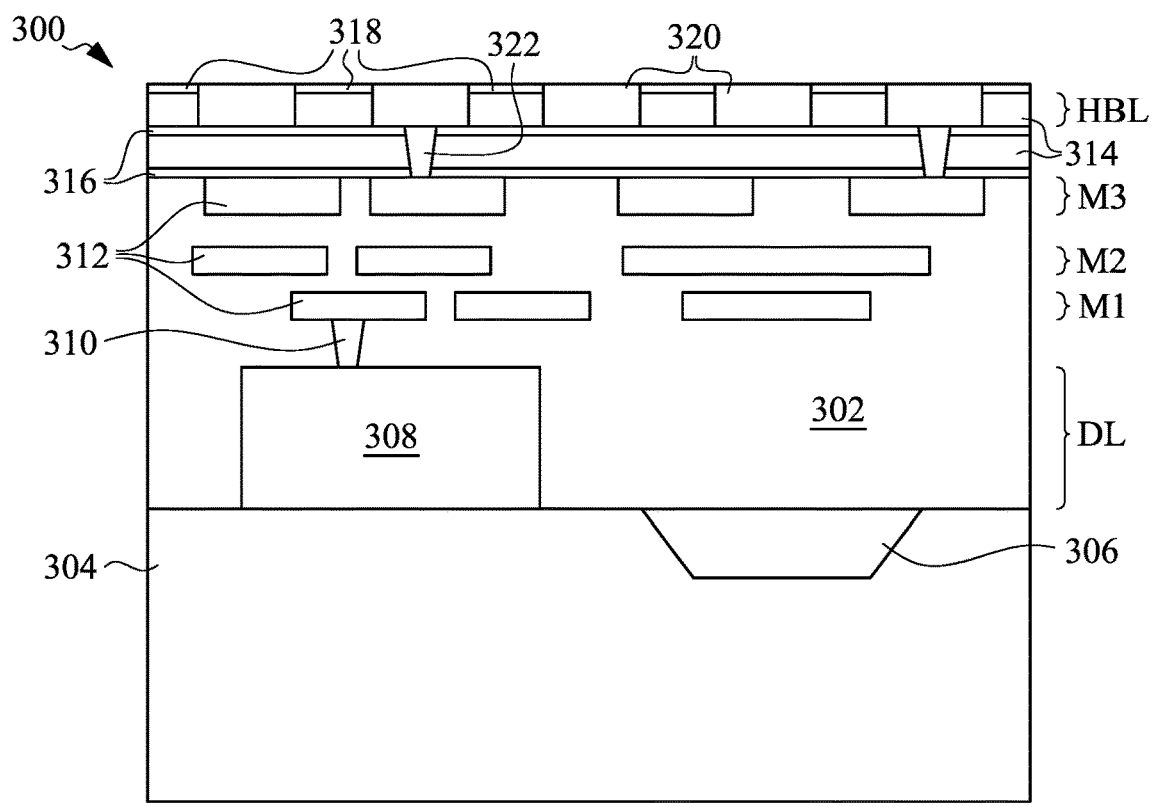
FIG. 3B is a cross-sectional view of a portion of the second wafer including the second device structure and a bonding layer, in accordance with some embodiments.

FIG. 3A is a cross-sectional view of a portion of the first wafer 200 including the first device structure 206 and a bonding layer (e.g., hybrid bonding layer (HBL)), in accordance with some embodiments. FIG. 3B is a cross-sectional view of a portion of the second wafer 300 including the second device structure 308 and a bonding layer, in accordance with some embodiments. Referring to FIGS. 3A-B, dielectric material layers 214, 314 may be deposited over the upper surfaces of each of the respective wafers 200, 300. The dielectric material layers 214, 314 may be deposited over the uppermost metal level of the interconnect structure of each of the wafers 200, 300, such as over the upper surface of the dielectric material 202, 302 and the exposed upper surfaces of the metal lines 212, 312 of the uppermost metal level. As shown, the uppermost metal level of the first wafer 200 can be the fifth metal level (M5) and the uppermost metal level of the second wafer 300 can be the third metal level (M3). Each of the dielectric material layers 214, 314 may include a suitable dielectric material, such as gate oxide, silicon oxide, silicon nitride, etc., and may be deposited using a suitable deposition process as described above.

In some implementations, one or more dielectric material films or layers 216, 218, 316, 318 can be interposed between the dielectric material layers 214, 314. The dielectric material films 216, 218, 316, 318 can include one or more suitable dielectric materials, such as silicon nitride (SiN), silicon oxy nitride (SiON), etc, and may be deposited using a suitable deposition process. For example, the dielectric material films 216, 316 can be deposited over the upper surface of the dielectric material 202, 302 and the exposed upper surfaces of the metal lines 212, 312 of the uppermost metal level. The dielectric material layer 214, 314 can be deposited over the dielectric material film 216, 316. An additional dielectric material film 216, 316 can be deposited over the dielectric material layer 214, 314 for further deposition of an additional dielectric material layer 214, 314. Although in various exemplary embodiments shown herein, the first wafer 200 and the second wafer 300 can include two levels of the dielectric material layers 214, 314 (e.g., deposited over the dielectric material films 216, 316), it will be understood that the first wafer 200 and the second wafer 300 may have a different number or level of dielectric material layer 214, 314.

The uppermost level/layer of the dielectric material layers 214, 314 can be a part of a hybrid bonding layer (HBL). The first wafer 200 can include a first HBL, and the second wafer 300 can include a second HBL. Above the dielectric material layer 214, 314 at the uppermost layer, at least one dielectric material film or layer 218, 318 can be deposited over the dielectric material layer 214, 314. The dielectric material film 218, 318 can be deposited using at least one suitable deposition process. The dielectric material film 218, 318 can include a suitable dielectric material, such as dielectric material similar to or different from the dielectric material film 216, 316. In some cases, the dielectric material layer 214, 314 and the dielectric material film 216, 218, 316, 318 can be a part of the interconnect structures of the wafers 200, 300.

One or more trench openings and via openings can be formed within or through the dielectric material layers 214, 314 and dielectric material films 216, 218, 316, 318 of each wafer 200, 300. For example, one or more masks (not shown) can be used or formed over an upper surface of the dielectric material layer 214, 314 and/or dielectric material film 218, 318. The mask may be lithographically patterned to form openings through the mask. The openings may correspond to a pattern of via openings that may be subsequently formed through the respective dielectric material layers 214, 314 and/or the respective dielectric material film 218, 318. For example, one or more via openings can be formed at one or more portions through the dielectric material layers 214, 314 and/or dielectric material films 216, 218, 316, 318. In some embodiments, the mask formed over or used for the first wafer 200 can include the same pattern as or different patterns from the second wafer 300.

After forming the masks, an etching process (e.g., anisotropic etch process, etc.) can be performed through each of the patterned masks to remove portions of the dielectric material layer 214, 314, and/or the dielectric material film 216, 218, 316, 318. The via opening formed subsequent to performing the etching process can expose a surface (e.g., the top) of at least a portion of the metal line 212, 312. For example, as shown for the first wafer 200, the via opening can expose the metal line 212 of the fifth metal level (M5). As shown in the second wafer 300, the via opening can expose the metal line 312 of the third metal level (M3). Once the one or more openings are formed, the mask can be removed via a suitable process, such as by ashing or dissolution by a solvent.

Similar process to form the via opening can be performed for forming the trench opening. For example, one or more masks having a predetermined pattern can be formed over the top of each wafer 200, 300. The pattern can form one or more opening(s) to enable an etching process to be performed. Accordingly, a suitable etching process can be performed through the patterned masks, thereby forming a trench opening through at least one dielectric material layer 214, 314, and/or dielectric material film 216, 218, 316, 318. Once the one or more openings are formed, the mask can be removed from the wafer 200, 300.

With the via opening and the trench opening, a layer of metal material 220, 320 can be deposited over the upper surface of the dielectric material layer 214, 314, and/or dielectric material film 218, 318, filling the via opening and trench opening. The deposited metal material 220, 320 can be at least one of a suitable electrically conductive material, such as tungsten (W), copper (Cu), a copper alloy, aluminum (Al), an aluminum alloy, combinations thereof, or the like. Other suitable metal materials are within the contemplated scope of disclosure. In some embodiments, a barrier layer (not shown) composed of a suitable barrier material as described above may be first deposited over the upper surfaces of dielectric material layers 214, 314 and within the trench openings and via openings, and the layer of metal material 220, 320 may be deposited over the barrier layer. The layer of metal material 220, 320 (and the barrier layer, if present) may be deposited using a suitable deposition process, which may include one or more of a chemical vapor deposition (CVD) process, a physical vapor deposition (PVD) process, an atomic layer deposition (ALD) process, an electroplating process, or the like. Other suitable deposition processes are within the contemplated scope of this disclosure.

In some implementations, each of the first and second wafers 200, 300 may undergo a planarization process, such as a chemical mechanical planarization (CMP) process, to remove the metal material 220, 320 and the barrier material, if present, from above the upper surface of the dielectric material layer 214, 314. The remaining metal material 220, 320 located within the trench openings and the via openings may form metal features of the hybrid bonding layer (HBL) and via structures 222, 322 (e.g., electrically) connecting the metal material 220, 320 to one or more metal lines 212, 312. The metal material 220, 320 may form a top metal level (TM) of the interconnect structures of each of the first and second wafers 100, 200. Each of the metal materials 220, 320 may have an exposed upper surface and may be connected to a metal material of an underlying metal level (e.g., M5 of the first wafer 200 and M3 of the second wafer 300) by the one or more via structures 222, 322.

Figure 4:
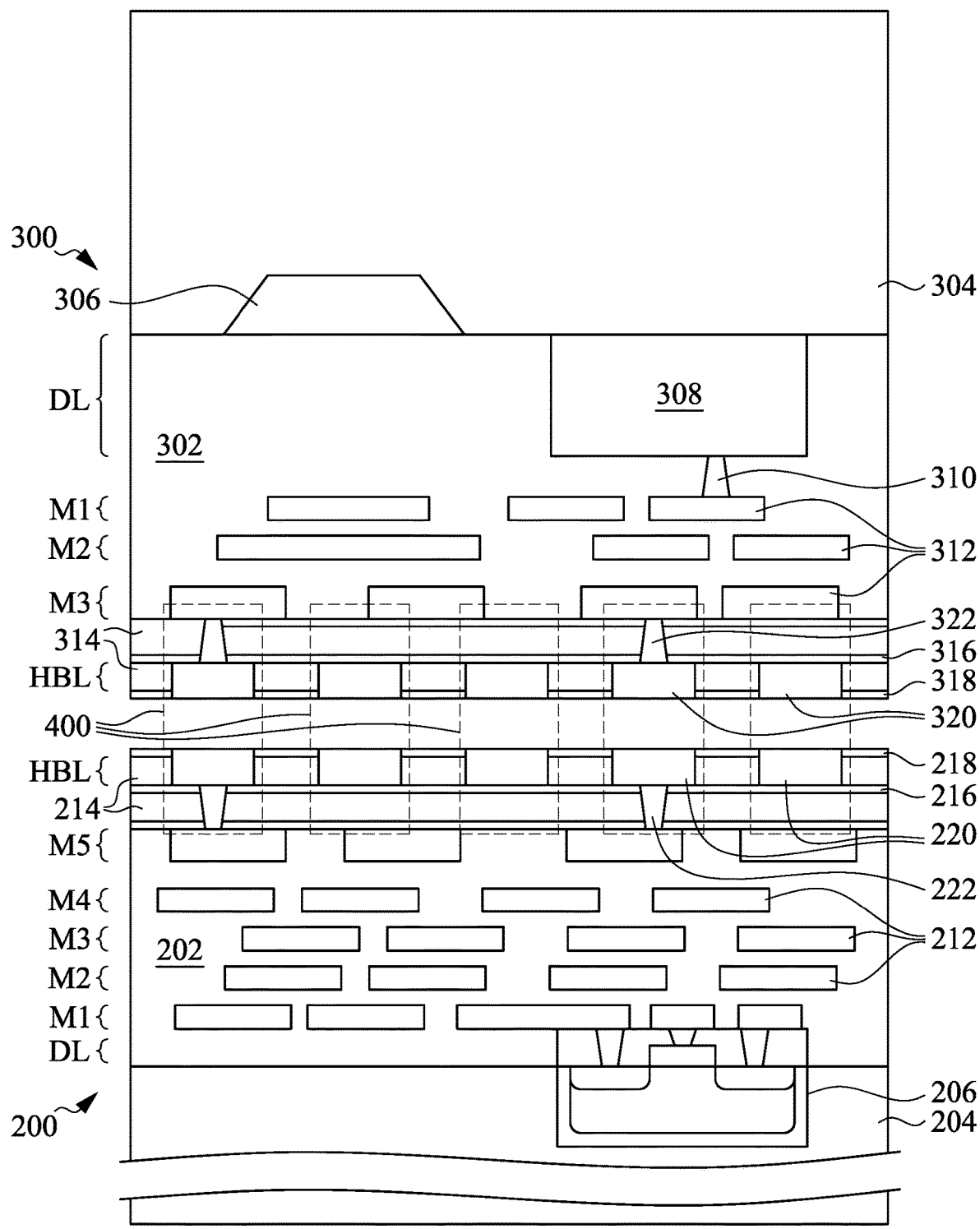
FIG. 4 is a cross-sectional view of a portion of the first wafer and a portion of the second wafer, in accordance with some embodiments.

FIG. 4 is a cross-sectional view of a portion of the first wafer 200 and a portion of the second wafer 300, in accordance with some embodiments. Upon depositing the metal material 220, 320, the first and second wafers 200, 300 can be positioned for bonding with each other. In various embodiments, the first wafer 200 may be bonded to the second wafer 300 using a hybrid bonding technique. In various implementations, the surfaces of the first and second wafers 200, 300 may be pre-treated to promote surface activation (e.g., using a plasma treatment process). The second wafer 300 may be flipped (e.g., inverted) and stacked onto the first wafer 200 so that the bonding layer (BL) of the second wafer 300 faces the bonding layer (BL) of the first wafer 200. In some cases, the first wafer 200 may be flipped instead of the second wafer 300, such that the first wafer 200 is stacked onto the second wafer 300.

Still referring to FIG. 4, as shown in portions 400, the metal materials 220, 320 can be aligned with each other. The metal materials 220, 320 can be referred to as bonding pads 220, 320. For example, the one or more bonding pads 220 (e.g., first bonding pads) of the first wafer 200 can be aligned with a corresponding one or more bonding pads 320 (e.g., second bonding pads) of the second wafer 300. The hybrid bonding layout or pattern (e.g., bonding pad positions) can be the same when the first and second wafers 200, 300 are facing each other.

Figure 5:
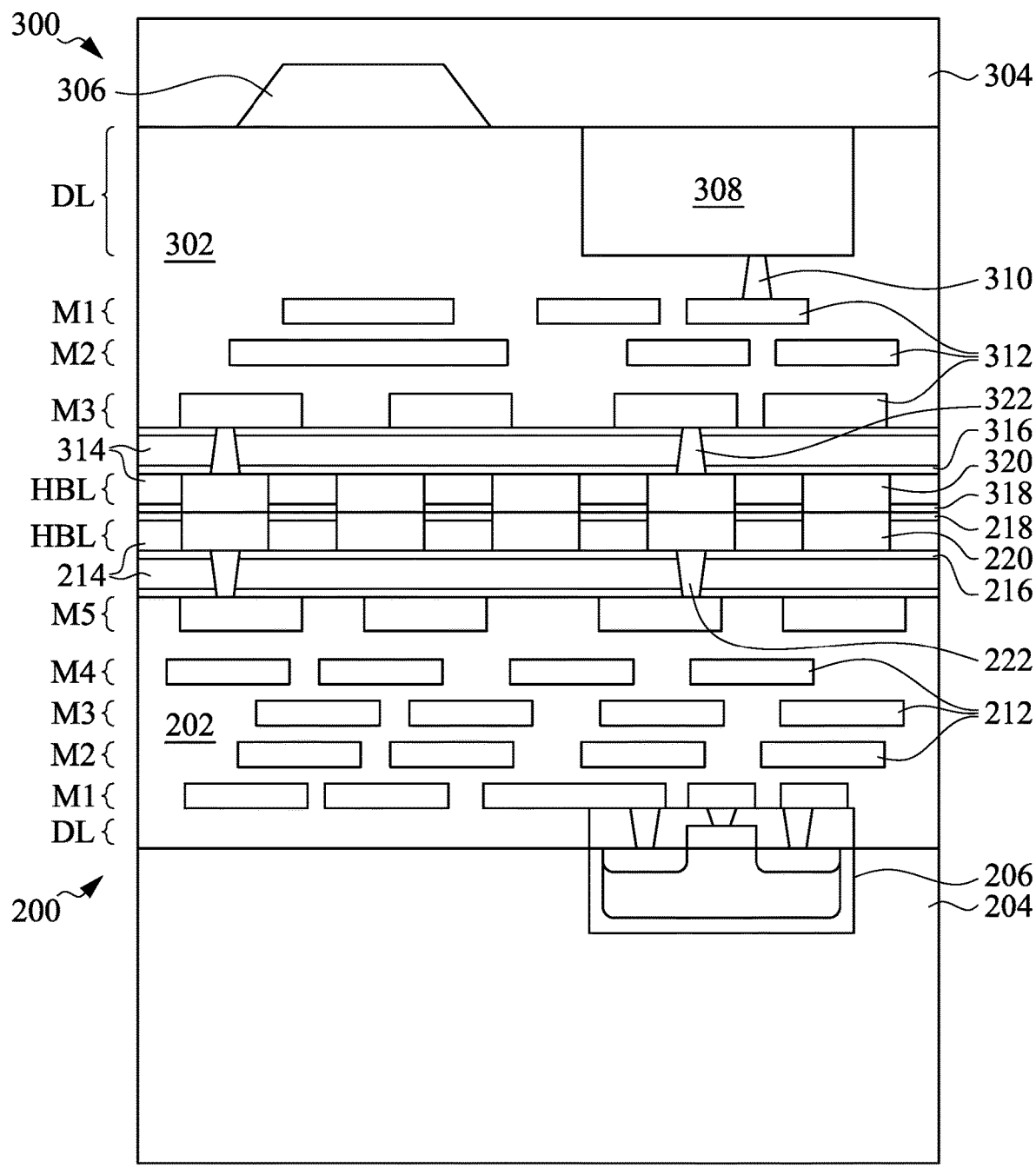
FIG. 5 is a cross-sectional view of a bonded wafer structure including the first wafer bonded to the second wafer, in accordance with some embodiments.

FIG. 5 is a cross-sectional view of a bonded wafer structure including the first wafer 200 bonded to the second wafer 300, in accordance with some embodiments. Subsequent to aligning the bonding pads 220, 320, the wafers 200, 300 can be stacked together. The stack of wafers 200, 300 may then be annealed at an elevated temperature. The bonding process may result in a diffusion bond forming between the bonding pads 220 of the first wafer 200 and the corresponding bonding pads 320 of the second wafer 300.

When the first and second wafers 200, 300 are bonded, the bonding pads 220, 320 can be (e.g., electrically) coupled, thereby allowing communication between the first wafer 200 and the second wafer 300. The bonding pads 220, 320, via structures 222, 322, interconnect structures (e.g., metal lines 212, 312, via structure between the metal lines 212, 312, etc.), among other components of the wafers 200, 300 can establish one or more (e.g., electrical) channels for communication between the first device structure 206 and the second device structure 308. For example, the first device structure 206 can include or correspond to a logic portion of the memory device 100, and the second device structure 308 can include or correspond to a memory portion of the memory device 100. Accordingly, once the wafers 200, 300 are bonded to form a bonded wafer structure, the first device structure 206 can be (e.g., electrically) coupled to the second device structure 308 through at least one of the bonding pads 220, 320, so as to collectively function as a memory device 100 (e.g., communication between the memory portion and the logic portion of the memory device 100).

In various implementations, one or more metal materials 220, 320 may be a hybrid bonding layer (HBL) dummy, such that the metal pattern formed by the metal materials 220, 320 of the first and second wafers 200, 300 are distributed uniformly. An HBL dummy can include metal materials 220, 320 that are not (e.g., electrically) connected to the metal lines 212, 312 of the first and/or second wafers 200, 300. For example, the first wafer 200 can include a pattern of five metal materials 220 (e.g., first to fifth metal materials from left to right), the first and fourth metal materials may not be the HBL dummy, and the second, third, and fifth metal materials may be the HBL dummy.

In some implementations, the backside of the substrate 304 of the second wafer 300 (e.g., the top wafer) can be thinned down or etched to reduce the dimension (e.g., height) of the bonded wafer structure. For example, the substrate 304 can be thinned down using at least one suitable etching technique to a remaining height of 3 μm to 5 μm, or other desired dimensions. In some implementations, if the first wafer 200 is on top, the substrate 204 of the first wafer 200 may be thinned down or etched. In some cases, the height of both substrates 204, 304 of the first and second wafers 200, 300 can be reduced.

Figure 6:
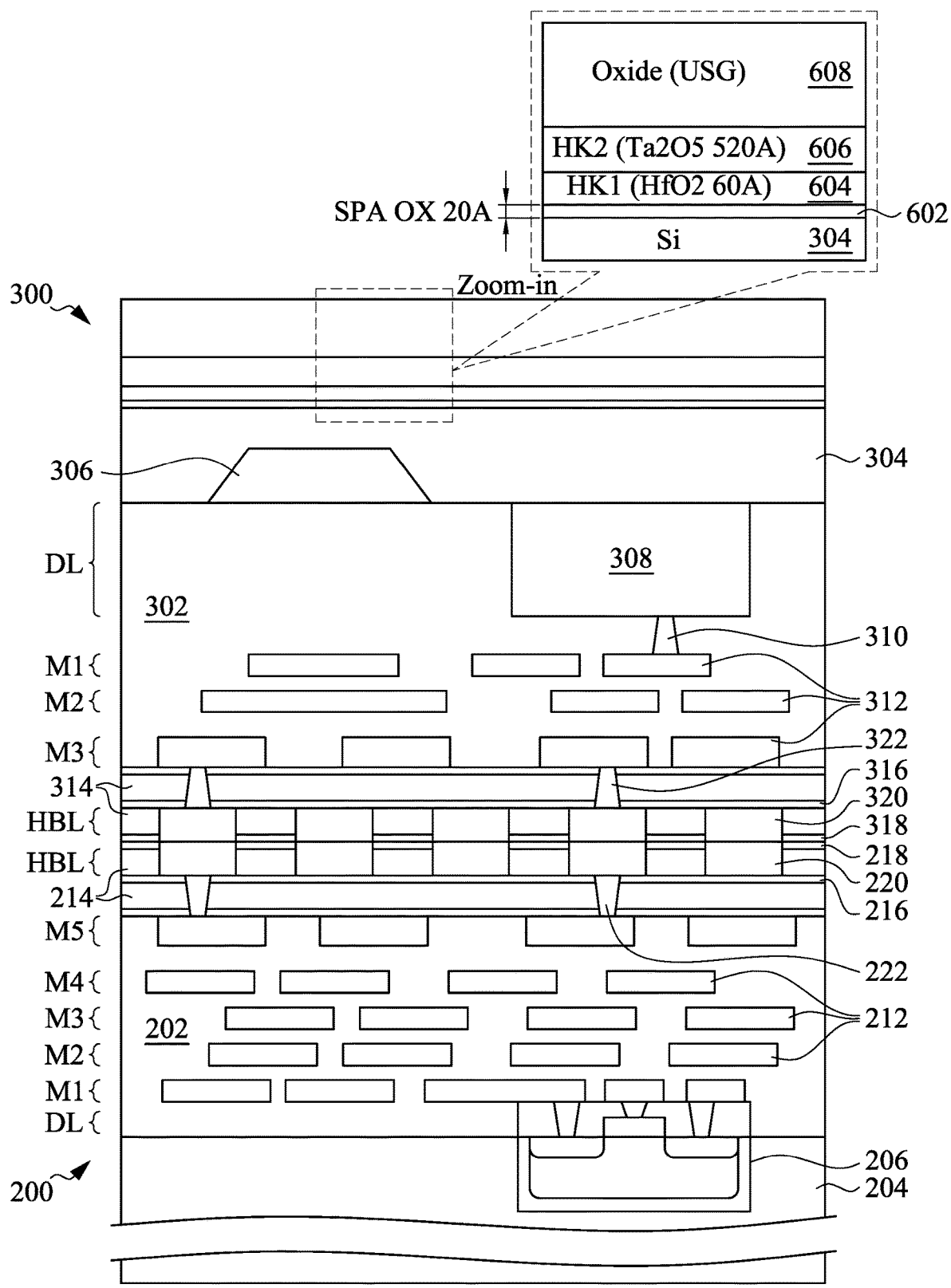
FIG. 6 is a cross-sectional view of the bonded wafer structure including deposited films, in accordance with some embodiments.

FIG. 6 is a cross-sectional view of the bonded wafer structure including deposited films, in accordance with some embodiments. In various implementations, one or more films or layers 602, 604, 606, 608 can be deposited above the bonded wafer structure using at least one suitable deposition process. Although the layers 602, 604, 606, 608 are shown to be deposited on the backside of the second wafer 300, these layers 602, 604, 606, 608 may additionally or alternatively be deposited on the backside of the first wafer 200. Further, it can be understood that more, fewer, or different materials or layers can be deposited over the bonded wafer structure. The layers 602, 604, 606, 608 can include at least one of high-k dielectric layer, buffer layer, oxide layer (e.g., to deposit undoped silicate glass (USG) for following backside through Si via (BTSV) process hard-mask), among other types of layers. The layers 602, 604, 606, 608 can be composed of one or more suitable materials, such as slot-plane antenna (SPA) oxide (OX), high-k dielectric material(s) (e.g., for built-in negative fixed charge or moisture prevention), oxide materials, among other dielectric materials. In some implementations, the stacking of individual layers 602, 604, 606, 608 can be based on the type of materials, for example, the layer 602 can be composed of SPA OX, the layers 604, 606 can be composed of high-k dielectric materials, and the layer 608 can be composed of an oxide material. In some other implementations, the layers 602, 604, 606, 608 can be stacked with different types of materials, combinations of materials, or in a different order.

Figure 7:
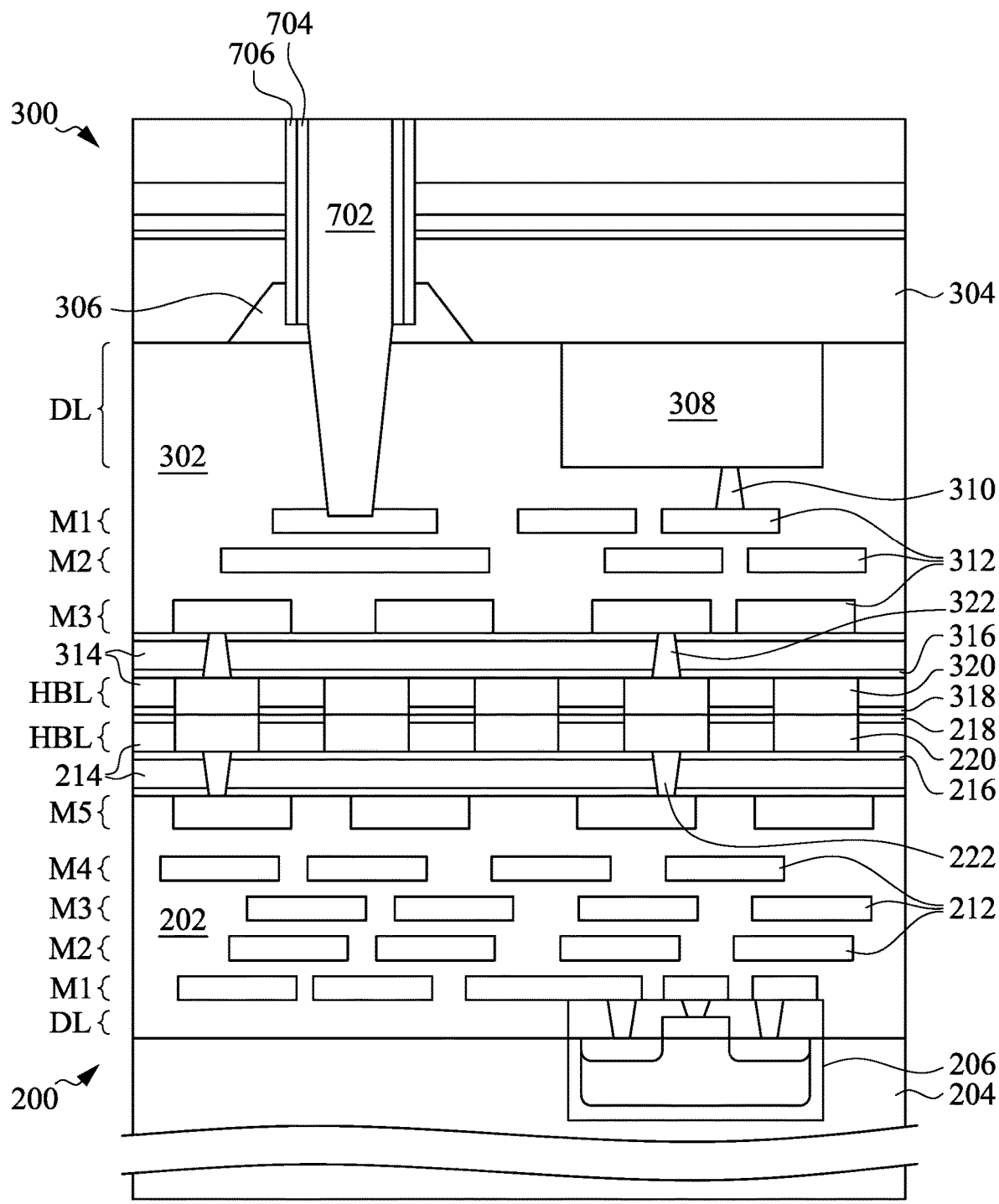
FIG. 7 is a cross-sectional view of the bonded wafer structure including a through via structure formed in the second wafer, in accordance with some embodiments.

FIG. 7 is a cross-sectional view of the bonded wafer structure including a through via structure formed in the second wafer, in accordance with some embodiments. In various implementations, a backside through Si via (BTSV) structure or pattern (e.g., sometimes referred to as a through via structure 702) can be formed in the bonded wafer structure. The through via structure 702 can be formed from the top of the bonded wafer structure. In this case, the BTSV structure can be formed on the backside of the second wafer 300. Although the through via structure 702 may be composed of silicon, the BTSV structure 702 may alternatively be composed of a different suitable conductive material for signal transmission or reception (e.g., signal output or input) or power connection (e.g., connection to external power). The bonded wafer structure may include one of the through via structure 702 or multiple through via structures.

To form the through via structure 702, one or more masks can be deposited over the surface of the bonded wafer structure (e.g., the top of the bonded wafer structure or on the backside of the second wafer 300). The one or more masks can be deposited over the layers 602, 604, 606, 608. The masks can have a predetermined pattern forming one or more channels or openings to enable an etching process to be performed. Once the masks are formed, at least one suitable etching process can be performed through the patterned masks, thereby forming at least one via structure opening through the layers 602, 604, 606, 608, and the substrate 304. At this process, the formed via structure opening can expose the surface of at least the STI structure 306. After the etching process is completed, the masks can be removed from the bonded wafer structure via a suitable process, such as by ashing or dissolution by a solvent, for example.

One or more dielectric materials 704, 706 can be filmed or deposited on the surface of the bonded wafer structure (e.g., layer 608), and within the via structure opening. As shown, two dielectric materials 704, 706 may be deposited at least within the via structure opening, which can include any dielectric material, such as silicon nitride, gate oxide, among others. The dielectric material 706 can be deposited before the dielectric material 704 using at least one suitable deposition process. After depositing the dielectric materials 704, 706, another etching process can be performed to remove the dielectric materials 704, 706, such as a blanket etching technique. After performing this etching technique, at least the surface of the metal line 312 at one of the metal levels (e.g., M1) can be exposed within the via structure opening.

The metal material can be deposited into the via structure opening formed by using the one or more etching techniques to form the through via structure 702. The metal material can be deposited using at least one suitable deposition process, such as described above. The metal material deposited at this process can be similar to or different from the metal materials used for at least one of the metal line 212, 312. As such, the through via structure 702 can extend at least between the surfaces of the second substrate 304 (e.g., from the frontside to the backside of the substrate 304). The through via structure 702 can penetrate through the shallow trench isolation (STI) structure 306. If the first wafer 200 is stacked above the second wafer 300, similar process can be performed to form the through via structure 702 extending, for example, at least from a first surface (e.g., backside or frontside) to a second surface opposite to the first surface of the first substrate 204. Forming the through via structure 702 can enable the first and second device structures 206, 308 that are collectively operating as a memory device 100 to transmit or receive signal(s) to or from external components. Further, the through via structure 702 can enable power connection to the first and second device structures 206, 308.

Upon forming the bonded wafer structure, the wafers 200, 300 can be diced, separated, or cut into various semiconductor devices (e.g., memory devices 100), such as shown in FIGS. 2A-11. As such, each of the wafers 200, 300 can include a number of the respective first and second device structures 206, 308. Additional processes can be performed on the wafers 200, 300 prior to dicing the wafers 200, 300, such as described herein. The wafers 200, 300 can be diced or the semiconductor devices of the wafers 200, 300 can be separated using at least one suitable dicing process, such as a laser-based technique, or a separation process, such as dice before grind (DBG).

In some implementations, the through via structure 702 can include a first through via structure and a second through via structure. The first through via structure can extend at least from a first surface (e.g., the frontside) of the second substrate 304 to (e.g., around) a middle portion of the second substrate 304. The second through via structure can be in (e.g., electrical) contact with the first through via structure and extend from the middle portion to a second surface (e.g., the backside) of the second substrate 304 opposite to the first surface. The second device structure 308 can be formed along the first surface of the second substrate 304. In some implementations, only the first through via structure can penetrate and extend through the STI structure 306 formed in the second substrate 304. The second through via structure may extend from at least the surface of the STI structure 306 to the second surface, for example.

Figure 8:
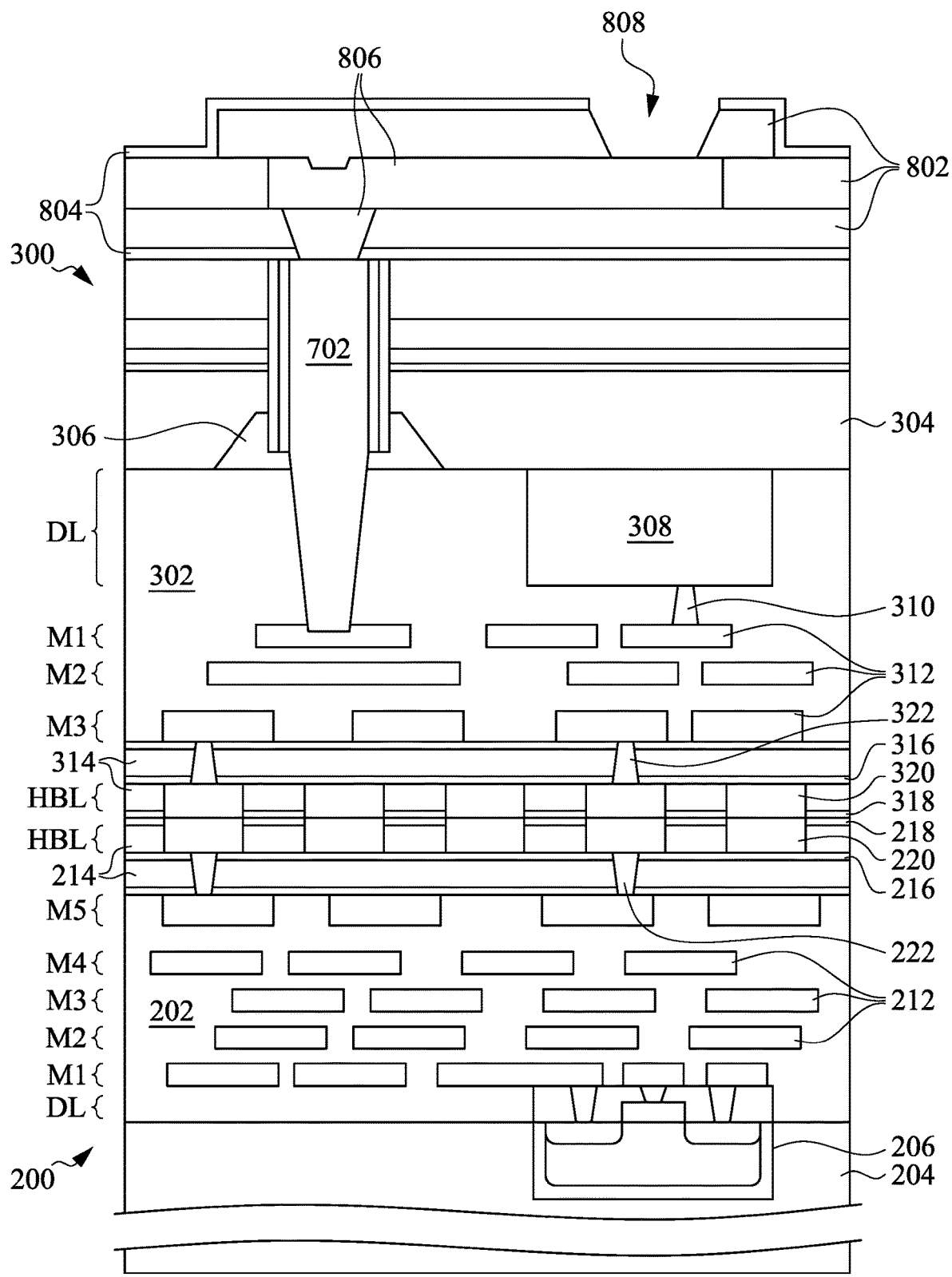
FIG. 8 is a cross-sectional view of the bonded wafer structure including the through via structure and a pass loop formed in the second wafer, in accordance with some embodiments.

FIG. 8 is a cross-sectional view of the bonded wafer structure including the through via structure 702 and a pass loop formed in the second wafer 300, in accordance with some embodiments. In various implementations, at least one contact pad 806 can be disposed over the top of the bonded wafer structure (e.g., above the second substrate 304 and/or the layer 608). Any suitable deposition technique can be performed herein. For example, the at least one film (e.g., pass film) composed of dielectric material 804 can be disposed above the second substrate 304. One or more layers of the interconnect structures (e.g., dielectric material 802) can be disposed or formed above the dielectric material 804. One or more masks having a predefined pattern can be deposited above the dielectric materials 802, 804. Once the masks are formed, at least one suitable etching technique can be performed to form a via opening and a trench opening within the dielectric materials 802, 804. These openings can expose the surface of the through via structure 702.

The contact pad 806 can be deposited above the second substrate 304 (e.g., at the backside of the second wafer 300 or above the bonded wafer structure) and into the via opening and the trench opening within the dielectric materials 802, 804. The contact pad 806 can be composed of suitable conductive or metal materials, such as aluminum, copper, etc. Hence, the contact pad 806 can be formed and (e.g., electrically) coupled with the through via structure 702. The through via structure 702 can (e.g., electrically) couple the contact pad 806 with one or more interconnect structures 312 (e.g., metal line 312), and further to the first device structure 206 through at least one of the bonding pads 220, 320 and interconnect structures 212. The through via structure 702 can also (e.g., electrically) couple the contact pad 806 with the second device structure 308. Another etching technique may be performed to remove the contact pad 806 from above the dielectric materials 804 and/or outside of the via opening and trench opening. In some implementations, additional dielectric materials 802, 804 can be deposited above the contact pad 806. The dielectric materials 802, 804 above the contact pad 806 can be etched using any suitable masking pattern and etching technique, such as to expose the surface of the contact pad 806 (e.g., portion 808).

Figure 9:
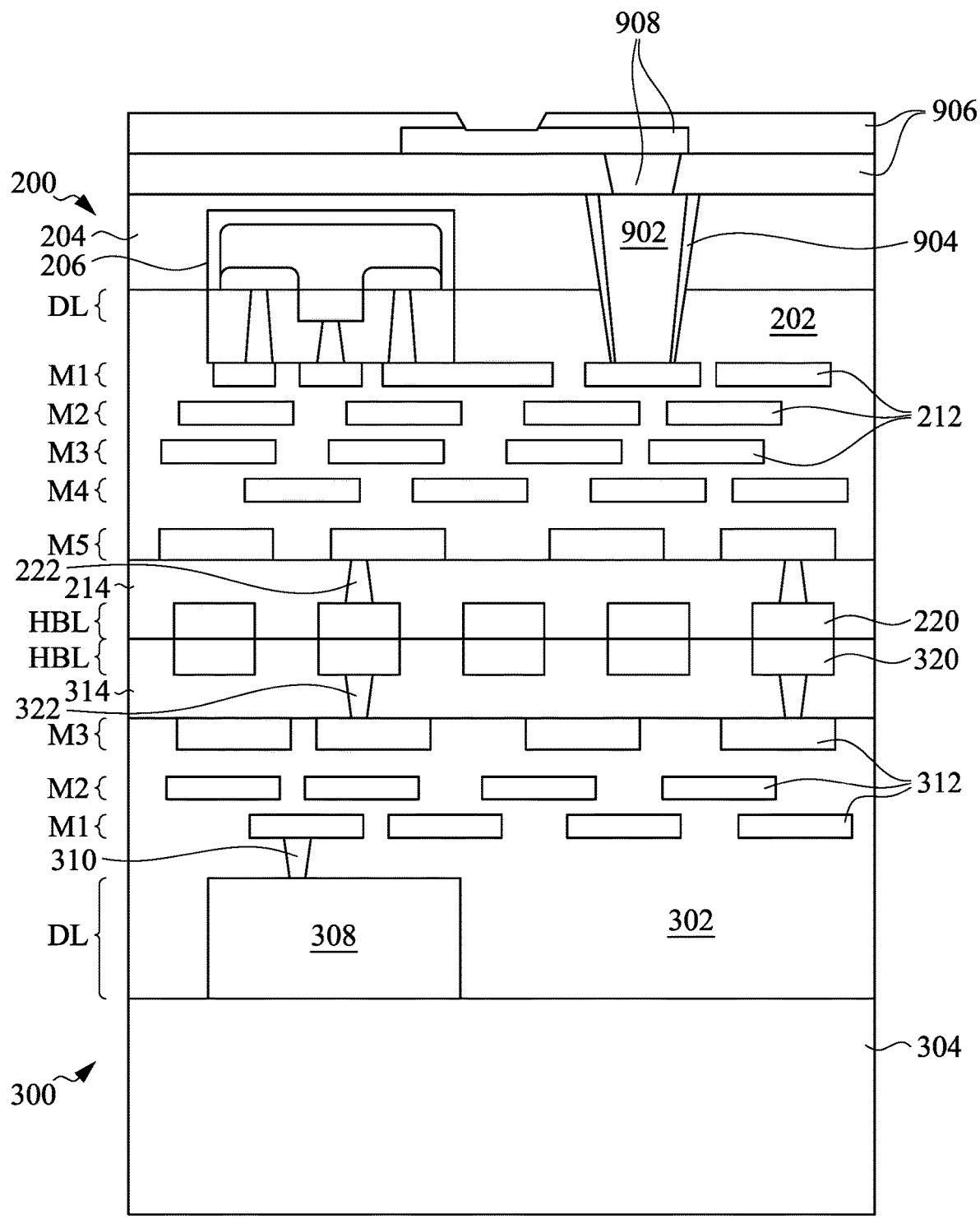
FIG. 9 is a cross-sectional view of the bonded wafer structure including a through via structure and a pass loop formed in the first wafer, in accordance with some embodiments.

FIG. 9 is a cross-sectional view of the bonded wafer structure including a through via structure 902 and a pass loop formed in the first wafer 200, in accordance with some embodiments. In various implementations, a through via structure 902 can be formed in the first wafer 200. For example, the first wafer 200 can be inverted and stacked above the second wafer 300. The first wafer 200 can be bonded with the second wafer 300 via at least one suitable bonding technique. As such, the first wafer 200 can be the top wafer of the bonded wafer structure. The through via structure 902, the dielectric materials 904, 906, and the contact pad 908 can be formed using similar or suitable techniques described in at least FIGS. 7-8. The through via structure 902 can extend from at least a first surface (e.g., frontside) to a second surface (e.g., backside) opposite of the first surface of the first substrate 204. Further, the through via structure 902 (and the dielectric material 904) can extend from at least the first surface to the surface of the metal line 212, among other interconnect structures.

The contact pad 908 can be formed above the bonded wafer structure. In this case, the contact pad 908 can be formed at the backside of the first wafer 200. The contact pad 908 can be (e.g., electrically) coupled to the through via structure 902. Hence, the through via structure 902 can provide (e.g., electric) coupling between the contact pad 908 to at least one of the interconnect structures 212, 312, the bonding pads 220, 320, the first device structure 206, and/or the second device structure 308.

Figure 10:
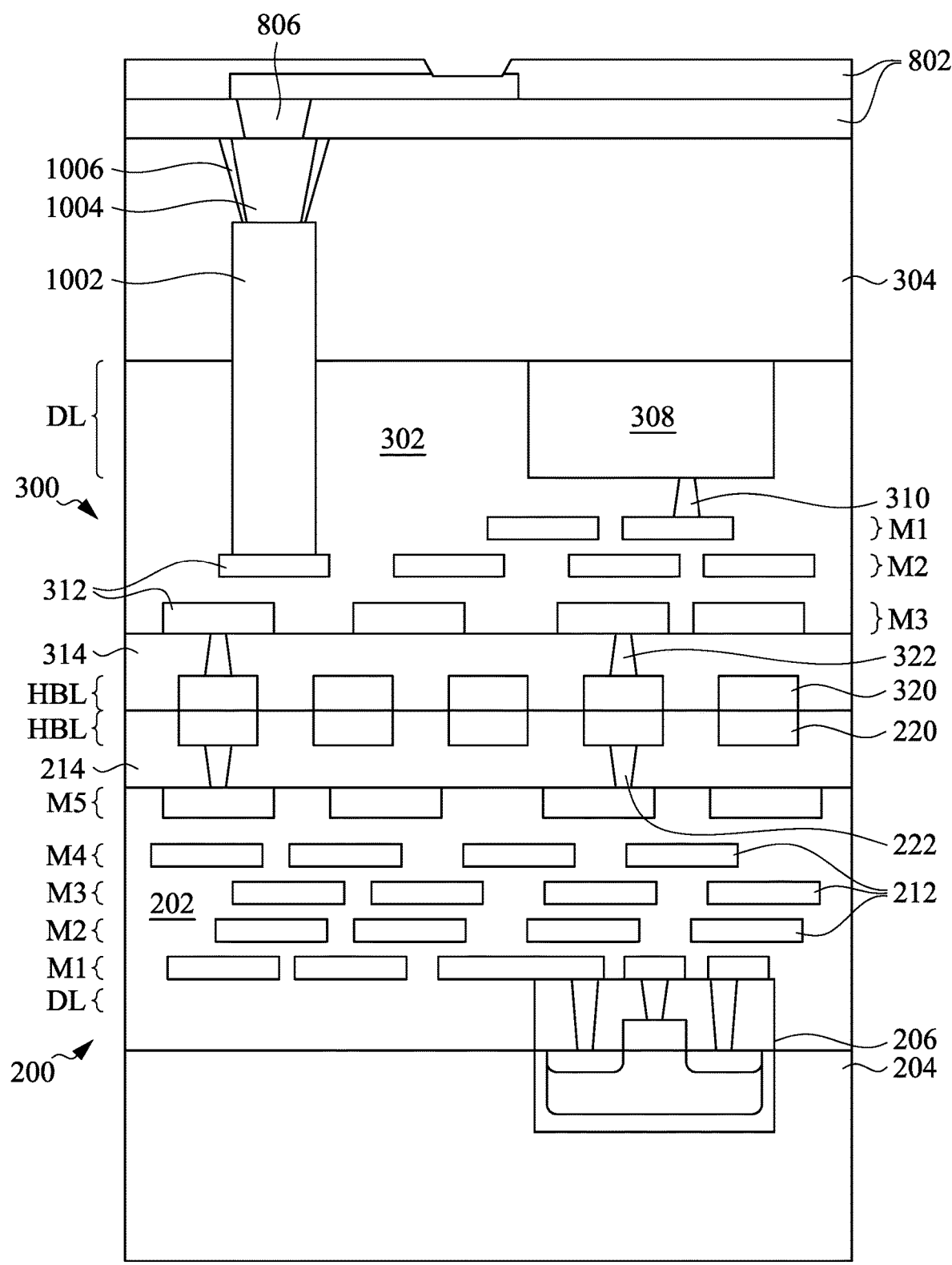
FIG. 10 is a cross-sectional view of the bonded wafer structure including a first through via structure and a second through via structure formed in the second wafer, in accordance with some embodiments.

FIG. 10 is a cross-sectional view of the bonded wafer structure including a first through via structure and a second through via structure formed in the second wafer, in accordance with some embodiments. In various implementations, multiple through via structures 1002, 1004 can be formed through the second substrate 304. The through via structure 1002 can be formed from the frontside surface of the substrate 304, and the through via structure 1004 can be formed from the backside surface of the substrate 304. For example, the through via structure 1002 may be formed subsequently to the formation of the second device structure 308 and prior to the formation of the interconnect structures 310-312, and the through via structure 1002 may be formed subsequently to bonding the second wafer 300 to the first wafer 200. The through via structure 1002, 1004 can be formed via suitable masking, etching, and deposition techniques. The through via structures 1002, 1004 can be composed of similar or different metal materials as at least one of the through via structures 702, 902.

In this case, a first through via structure 1002 can extend at least from the first surface (e.g., frontside) of the second substrate 304 to a middle portion of the second substrate 304. Further, the first through via structure 1002 can extend from the first surface of the second substrate 304 to (e.g., electrically) coupled with the metal line 312. A second through via structure 1004 can be formed at least from the middle portion of the second substrate 304 to the second surface (e.g., backside) opposite to the first surface of the second substrate 304. The second through via structure 1004 can be surrounded or include dielectric material 1006 along the sides. The dielectric material 1006 can be interposed between the second substrate 304 and the second through via structure 1004. The first through via structure 1002 may not be surrounded by a dielectric material. The first and second through via structures 1002, 1004 can (e.g., electrically) couple the contact pad 806 with at least one of the interconnect structures 212, 312, bonding pads 220, 320, the first device structure 206, and/or the second device structure 308.

In some implementations, the STI structure 306 may be formed in other area of the second substrate 304. Accordingly, the first and second through via structure 1002, 1004 can extend from the first surface to the second surface of the second substrate 304 without penetrating through any STI structure. In some implementations, the STI structure can be included as part of the second substrate 304, and at least one of the first or second through via structure 1002, 1004 can extend through the STI structure.

Figure 11:
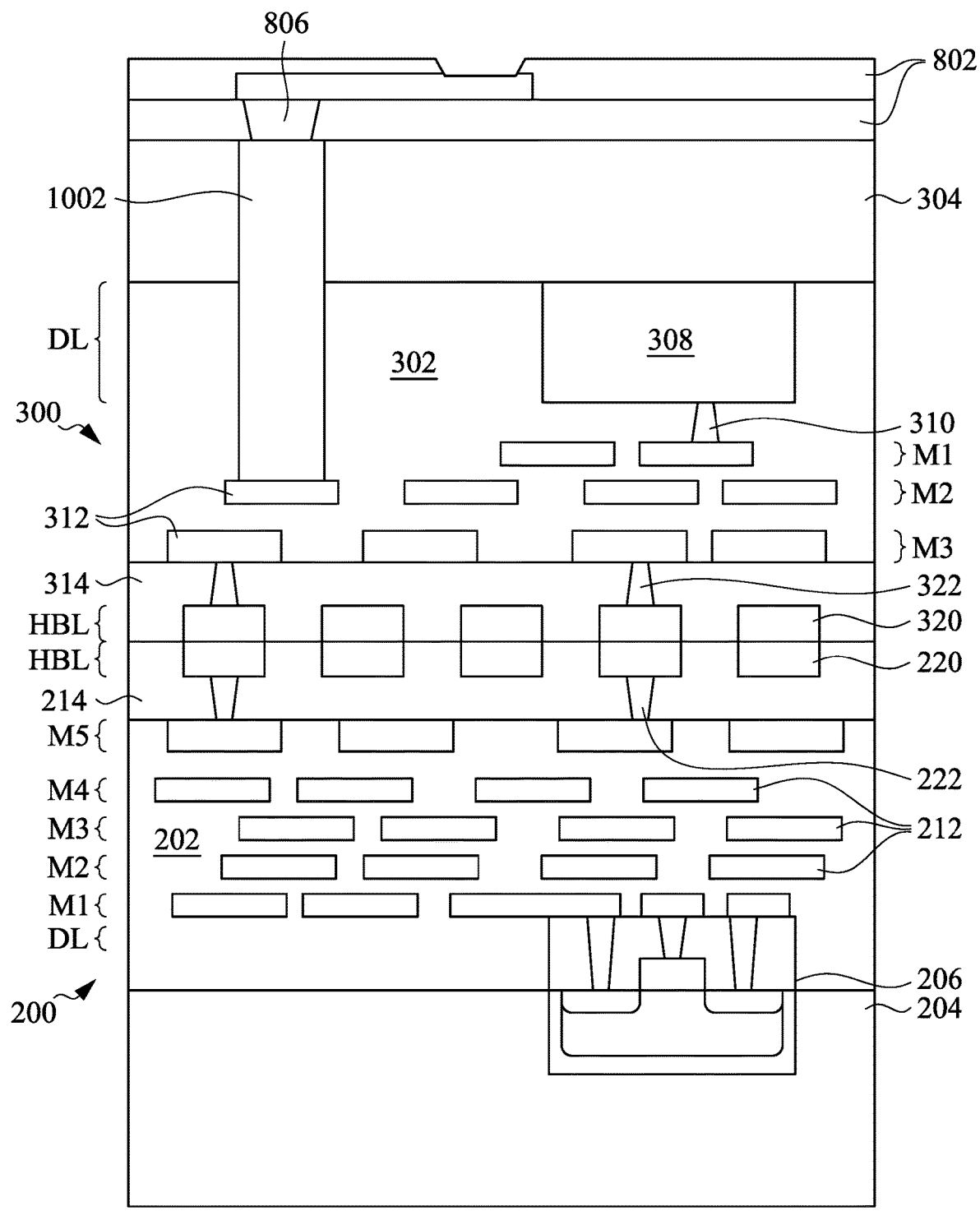
FIG. 11 is a cross-sectional view of the bonded wafer structure including the first through via structure without the second through via structure formed in the second wafer, in accordance with some embodiments.

FIG. 11 is a cross-sectional view of the bonded wafer structure including the first through via structure 1002 without the second through via structure 1004 formed in the second wafer 300, in accordance with some embodiments. In various implementations, the second through via structure 1004 (and the dielectric material 1006) may not be formed in the second substrate 304. In this case, the first through via structure 1002 can extend at least from the first surface to the second surface of the second substrate 304. Further, the first through via structure 1002 can (e.g., electrically) couple the contact pad 806 to at least one of the interconnect structures 212, 312, bonding pads 220, 320, the first device structure 206, and/or the second device structure 308. In some implementations, if the first wafer 200 is inverted and stacked above the second wafer 300, the first through via structure 1002 can be extend at least from the first surface to the second surface of the first substrate 204.

Figure 12:
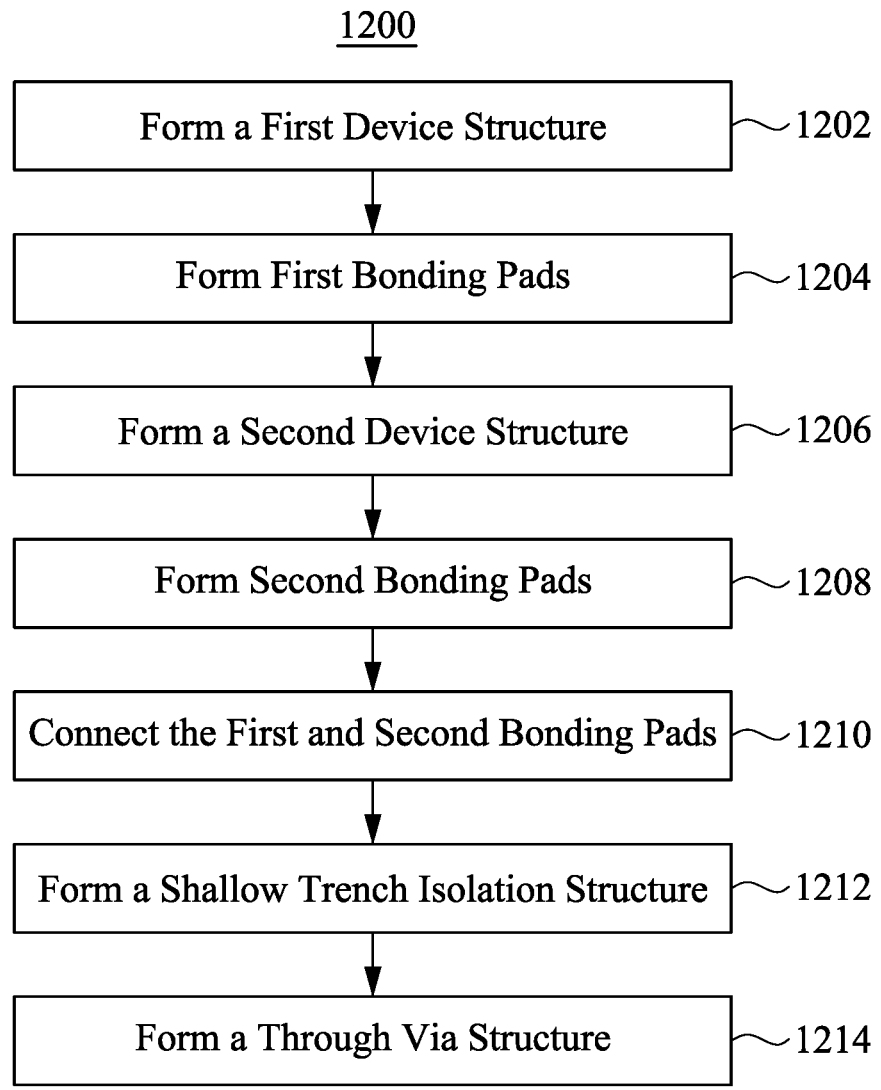
FIG. 12 is an example flow chart of a method of forming a bonded wafer structure, in accordance with some embodiments.

FIG. 12 is an example flow chart of a method 1200 of forming a bonded wafer structure, in accordance with some embodiments. Referring to at least FIG. 2A and according to various embodiments of the present disclosure, in step 1202 of method 1200, a first device structure (e.g., 206) can be formed on a first substrate (e.g., 204) of a first wafer (e.g., 200). The first device structure can function or operate as a logic portion of a memory device (e.g., 100). For example, the first device structure can be formed along a first surface (e.g., the frontside) of the first substrate.

Referring to at least FIG. 3A and according to various embodiments of the present disclosure, in step 1204 of method 1200, various first bonding pads (e.g., 220) can be formed over the first device structure and the first substrate. The first bonding pads can be formed in predefined pattern, such as a uniformly distributed metal pattern of the first bonding pads. The first bonding pads can be associated with or included at a first bonding layer (e.g., HBL). The first bonding layer can be disposed over or above the first substrate and the first device structure. Further, various first interconnect structures (e.g., 202, 208, 210, 212, etc.) can be formed and interposed between the first device structure and the first bonding pads of the first bonding layer. The various first interconnect structures can (e.g., electrically) couple the first device structure to at least one of the first bonding pads (e.g., non-dummy bonding pads, such as a bonding pad with a via structure coupled to at least one metal line of a metal level).

Referring to at least FIG. 2B and according to various embodiments of the present disclosure, in step 1206 of method 1200, a second device structure (e.g., 308) can be formed on a second substrate (e.g., 304). The second device structure can function or operate as a memory portion of the memory device (e.g., 100). The second device structure and the second substrate can be a part of a second wafer (e.g., 300), such as formed or deposited above the second wafer.

Referring to at least FIG. 3B and according to various embodiments of the present disclosure, in step 1208 of method 1200, various second bonding pads (e.g., 320) can be formed over the second device structure and the second substrate. The second bonding pads can be formed in a predefined pattern at a second bonding layer. The pattern of the second bonding pads can be similar to the pattern of the first bonding pads. Second interconnect structures (e.g., 302, 310, 312, etc.) can be formed and interposed between the second device structure and the second bonding pads of the second bonding layer. The second interconnect structures can provide (e.g., electrical) coupling between the second device structure and at least one of the second bonding pads through various via structures and metal lines (e.g., 312).

Referring to at least FIGS. 4-5 and according to various embodiments of the present disclosure, in step 1210 of method 1200, the first bonding pads of the first wafer and the second bonding pads of the second wafer can be connected, respectively. For example, the second wafer can be inverted (e.g. flipped) and the respective bonding pads of the first and second wafers can be aligned. In this case, the first bonding pads are each aligned with a corresponding one of the second bonding pads. Once aligned, the second bonding pads can be stacked on top of the first bonding pads and bonded using at least one suitable bonding technique, such as discussed above. In some cases, the first wafer can be inverted and stacked over the second wafer. It can be understood that similar processes or techniques can be performed or applied when the first wafer is stacked on the second wafer.

The coupling of the first and second wafers (e.g., the first and second bonding pads) can operatively couple the memory portion associated with the second device structure to the logic portion associated with the first device structure. For example, the first device structure can be (e.g., electrically) coupled to the second device structure, through at least one of the first bonding pads and at least one of the second bonding pads, so as to collectively function as a memory device. The memory portion and the logic portion can communicate with each other to collective function as a memory device via at least the various interconnect structures and bonding pads.

With the second wafer disposed over the first wafer, the second bonding layer can be disposed over the first bonding layer, the second device structure can be disposed over the second bonding layer, and the second substrate can be disposed over the second device structure (e.g., the structures or components of the second wafers are inverted). Accordingly, the first device structure can operatively function as a logic portion of the memory device, and the second device structure operatively functions as a memory portion of the memory device. In some implementations, the first device structure can operatively function as a memory portion of the memory device, and the second device structure operatively functions as a logic portion of the memory device. The memory device can include a high bandwidth memory device.

Referring to at least FIG. 2B and according to various embodiments of the present disclosure, in step 1212 of method 1200, a shallow trench isolation (STI) structure can be formed in the second substrate. In some implementations, additionally or alternatively, the STI structure can be formed in the first substrate. For purposes of examples herein, the STI structure can be formed in the second substrate or is a part of the second substrate. The STI structure can be formed along a frontside (e.g., a first surface) of the second substrate. The STI structure can be interposed between a portion of the second interconnect structures (e.g., 302) and the second substrate.

Referring to at least FIGS. 7-11 and according to various embodiments of the present disclosure, in step 1214 of method 1200, subsequently to the step of connecting or coupling the second bonding pads to the first bonding pads, respectively, a through via structure (e.g., 702, 902, 1002, and/or 1004) can be formed. The through via structure can extend at least from a backside surface (e.g., a second surface) of the second substrate to a frontside surface (e.g., a first surface opposite to the second surface) of the second substrate along which the second device structure is formed. The through via structure can be in (e.g., electrical) contact or connection with at least one of the second interconnect structures. For example, the through via structure can be in electrical contact with the at least one metal line (e.g., 312) of the second interconnect structures. Through the first and second interconnect structures and the first and second bonding pads, the through via structure can be (e.g., electrically) coupled with the first device structure and the second device structure.

In various implementations, the through via structure can penetrate through the STI structure formed in the second substrate. For instance, the through via structure can extend from the frontside of the STI structure (e.g., the frontside of the second substrate) to the backside of the second substrate. In various implementations, a contact pad (e.g., 806, 908) can be disposed over the second substrate. The contact pad can be (e.g., electrically) coupled to the through via structure. The through via structure can provide or enable (e.g., electrically) coupling for the contact pad to at least one of the second interconnect structures, which can further (e.g., electrically) couple the contact pad to the first device structure through at least one first bonding pad, at least one second bonding pad, and at least one of the second interconnect structures.

In some implementations, the through via structure can include multiple portions, such as a first through via structure and a second through via structure. The first through via structure can extend at least from the first surface (e.g., the frontside) of the second substrate to around a middle portion (e.g., a midpoint) of the second substrate. The second through via structure can be in (e.g., electrical) contact with the first through via structure (e.g., at the middle portion) and extend from the middle portion to the second surface (e.g., backside) opposite to the first surface of the second substrate. The second device structure can be formed along the first surface.

In some implementations, the first through via structure (e.g., a first portion of the through via structure) can penetrate through the STI structure formed in the second substrate. For example, the first through via structure can extend from a frontside surface of the STI structure to a backside surface of the STI structure. In some cases, the backside surface can be positioned around the middle portion of the second substrate.

In one aspect of the present disclosure, a semiconductor device is disclosed. The semiconductor device includes a first wafer comprising a first substrate, a first device structure, and a first bonding layer having a pattern of first bonding pads. The first bonding layer is disposed over the first substrate and the first device structure. The semiconductor device includes a second wafer comprising a second substrate, a second device structure, and a second bonding layer having a pattern of second bonding pads. The second bonding layer is disposed over the first bonding layer, the second device structure is further disposed over the second bonding layer, and the second substrate is further disposed over and the second device structure. The first bonding pads are each aligned with a corresponding one of the second bonding pads. The first device structure is electrically coupled to the second device structure, through at least one of the first bonding pads and at least one of the second bonding pads, so as to collectively function as a memory device.

In another aspect of the present disclosure, a semiconductor device is disclosed. The semiconductor device includes a first substrate having a first frontside and a first backside. The semiconductor device includes a first device structure disposed on the first frontside and functioning as a logic portion of a memory device. The semiconductor device includes a plurality of first bonding pads disposed on the first frontside and over the first substrate. The semiconductor device includes a second substrate having a second frontside and a second backside, wherein the second frontside and first frontside face each other. The semiconductor device includes a second device structure disposed on the second frontside and functioning as a memory portion of the memory device. The semiconductor device includes a plurality of second bonding pads disposed on the second frontside, wherein each of the plurality of second bonding pads is in contact with a corresponding one of the plurality of first bonding pads.

In yet another aspect of the present disclosure, a method for forming semiconductor packages is disclosed. The method includes forming, on a first substrate, a first device structure functioning as a logic portion of a memory device. The method includes forming, over the first device structure, a plurality of first bonding pads. The method includes forming, on a second substrate, a second device structure functioning as a memory portion of the memory device. The method includes forming, over the second device structure, a plurality of second bonding pads. The method includes connecting the plurality of second bonding pads to the plurality of first bonding pads, respectively, so as to operatively couple the memory portion to the logic portion.

As used herein, the terms "about" and "approximately" generally mean plus or minus 10% of the stated value. For example, about 0.5 would include 0.45 and 0.55, about 10 would include 9 to 11, about 1000 would include 900 to 1100.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
    a first wafer comprising a first substrate, a first device structure, a plurality of first interconnect structures, and a first bonding layer having a pattern of first bonding pads, wherein the first bonding layer is disposed over the first substrate, the plurality of first interconnect structures, and the first device structure; and
    a second wafer comprising a second substrate, a second device structure, a plurality of second interconnect structures, and a second bonding layer having a pattern of second bonding pads, wherein the second bonding layer is disposed over the first bonding layer, the plurality of second interconnect structures is further disposed over the second bonding layer, the second device structure is further disposed over the plurality of second interconnect structures, and the second substrate is further disposed over the second device structure, wherein the pattern of the first bonding pads and the pattern of the second bonding pads respectively comprise dielectric structures and metal structures distributed uniformly and arranged in an alternating configuration,
    wherein one or more of the metal structures are electrically coupled to the plurality of first interconnect structures and the plurality of second interconnect structures, and at least one of the metal structures is disconnected from the plurality of first interconnect structures and the plurality of second interconnect structures,
    wherein the first bonding pads are each aligned with a corresponding one of the second bonding pads, and
    wherein the first device structure is electrically coupled to the second device structure, through at least one of the first bonding pads and at least one of the second bonding pads, so as to collectively function as a memory device.

2. The semiconductor package of claim 1, wherein the first device structure operatively functions as a logic portion of the memory device, and the second device structure operatively functions as a memory portion of the memory device.

3. The semiconductor package of claim 1, wherein the first device structure operatively functions as a memory portion of the memory device, and the second device structure operatively functions as a logic portion of the memory device.

4. The semiconductor package of claim 1, wherein the plurality of first interconnect structures is interposed between the first device structure and the first bonding layer, and the plurality of second interconnect structures is interposed between the second device structure and the second bonding layer.

5. The semiconductor package of claim 1, wherein the second wafer further comprises a through via structure extending at least from a first surface of the second substrate to a second, opposite surface of the second substrate, the second device structure being formed along the second surface.

6. The semiconductor package of claim 5, wherein the through via structure penetrates through a shallow trench isolation structure formed in the second substrate.

7. The semiconductor package of claim 5, further comprising a contact pad disposed over the second substrate, wherein the through via structure is configured to electrically couple the contact pad to at least one of the plurality of second interconnect structures, which is further electrically coupled to the first device structure through the at least one first bonding pad, the at least one second bonding pad, and at least one of the plurality of second interconnect structures.

8. The semiconductor package of claim 1, wherein the second wafer further comprises:
    a first through via structure extending at least from a first surface of the second substrate to a middle portion of the second substrate; and
    a second through via structure in electrical contact with the first through via structure and extending from the middle portion to a second, opposite surface of the second substrate;
    wherein the second device structure is formed along the first surface.

9. The semiconductor package of claim 8, wherein only the first through via structure penetrates through a shallow trench isolation structure formed in the second substrate.

10. The semiconductor package of claim 1, wherein the memory device includes a high bandwidth memory device.

11. A semiconductor package, comprising:
    a first substrate having a first frontside and a first backside;
    a first device structure disposed on the first frontside and functioning as a logic portion of a memory device;
    a plurality of first interconnect structures disposed on the first frontside and over the first substrate;

a plurality of first bonding pads disposed on the first frontside and over the plurality of first interconnect structures;

a second substrate having a second frontside and a second backside, wherein the second frontside and first frontside face each other;

a second device structure disposed on the second frontside and functioning as a memory portion of the memory device;

a plurality of second interconnect structures disposed on the second frontside; and a plurality of second bonding pads disposed on the second frontside, wherein each of the plurality of second bonding pads is in contact with a corresponding one of the plurality of first bonding pads, wherein a pattern of the plurality of first bonding pads and a pattern of the plurality of second bonding pads respectively comprise dielectric structures and metal structures distributed uniformly and arranged in an alternating configuration, and wherein one or more of the metal structures are electrically coupled to the plurality of first interconnect structures and the plurality of second interconnect structures, and at least one of the metal structures is disconnected from the plurality of first interconnect structures and the plurality of second interconnect structures.

12. The semiconductor package of claim 11, wherein:
the plurality of first interconnect structures is interposed between the first device structure and the plurality of first bonding pads; and
the plurality of second interconnect structures is interposed between the second device structure and the plurality of second bonding pads.

13. The semiconductor package of claim 11, wherein at least a first contacted pair of one of the first bonding pads and one of the second bonding pads operatively form a portion of a signal path between the first device structure and the second device structure, while at least a second contacted pair of one of the first bonding pads and one of the second bonding pads do not operatively form any signal path between the first device structure and the second device structure.

14. The semiconductor package of claim 13, wherein the first contacted pair of the first bonding pad and the second bonding pad are electrically coupled to one or more of the plurality of first interconnect structures and to one or more of the plurality of second interconnect structures, respectively.

15. The semiconductor package of claim 13, wherein the second contacted pair of the first bonding pad and the second bonding pad are not electrically coupled to any of the plurality of first interconnect structures or any of the plurality of second interconnect structures.

16. The semiconductor package of claim 11, further comprising:
a through via structure extending at least from the second backside to the second frontside; and
a contact pad disposed on the second backside;
wherein the through via structure is configured to electrically couple a signal or power between the second device structure and the contact pad.

17. The semiconductor package of claim 11, further comprising:
a contact pad disposed on the second backside;
a first through via structure extending at least from the second backside to a middle portion of the second substrate; and
a second through via structure extending from the middle portion to at least the second frontside,
wherein the first and second through via structures are collectively configured to electrically couple a signal or power between the second device structure and the contact pad.

18. A method for forming semiconductor packages, comprising:
forming, on a first substrate, a first device structure functioning as a logic portion of a memory device;
forming, over the first device structure, a plurality of first interconnect structures:
forming, over the plurality of first interconnect structures, a plurality of first bonding pads;
forming, on a second substrate, a second device structure functioning as a memory portion of the memory device;
forming, over the second device structure, a plurality of second interconnect structures;
forming, over the plurality of second interconnect structures, a plurality of second bonding pads; and
connecting the plurality of second bonding pads to the plurality of first bonding pads, respectively, so as to operatively couple the memory portion to the logic portion,
wherein a pattern of the plurality of first bonding pads and a pattern of the plurality of second bonding pads respectively comprise dielectric structures and metal structures distributed uniformly and arranged in an alternating configuration, and
wherein one or more of the metal structures are electrically coupled to the plurality of first interconnect structures and the plurality of second interconnect structures, and at least one of the metal structures is disconnected from the plurality of first interconnect structures and the plurality of second interconnect structures.

19. The method of claim 18, subsequently to connecting the plurality of second bonding pads to the plurality of first bonding pads, respectively, further comprising forming a through via structure extending at least from a backside surface of the second substrate to a frontside surface of the second substrate along which the second device structure is formed.

20. The method of claim 19,
wherein the plurality of first interconnect structures is interposed between the first device structure and the plurality of first bonding pads,
wherein the plurality of second interconnect is structures interposed between the second device structure and the plurality of second bonding pads, and
wherein the through via structure is in electrical contact with at least one of the plurality of second interconnect structures.

* * * * *